(12) United States Patent
Kang et al.

(10) Patent No.: US 8,354,308 B2
(45) Date of Patent: Jan. 15, 2013

(54) CONDUCTIVE LAYER BURIED-TYPE SUBSTRATE, METHOD OF FORMING THE CONDUCTIVE LAYER BURIED-TYPE SUBSTRATE, AND METHOD OF FABRICATING SEMICONDUCTOR DEVICE USING THE CONDUCTIVE LAYER BURIED-TYPE SUBSTRATE

(75) Inventors: Pil-kyu Kang, Anyang-si (KR); Gil-heyun Choi, Seoul (KR); Dae-lok Bae, Seoul (KR); Byung-lyul Park, Seoul (KR); Dong-kak Lee, Seoul (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 13/221,158

(22) Filed: Aug. 30, 2011

(65) Prior Publication Data
US 2012/0052635 A1 Mar. 1, 2012

(30) Foreign Application Priority Data
Aug. 30, 2010 (KR) ........................ 10-2010-0084182

(51) Int. Cl.
*H01L 21/336* (2006.01)
*H01L 21/84* (2006.01)

(52) U.S. Cl. .. 438/151; 438/149; 438/459; 257/E21.411

(58) Field of Classification Search .................. 438/149, 438/151, 459
See application file for complete search history.

(56) References Cited

U.S. PATENT DOCUMENTS

| 7,157,352 | B2 * | 1/2007 | Yamanaka | 438/458 |
|---|---|---|---|---|
| 2006/0099791 | A1 * | 5/2006 | Mitani et al. | 438/612 |
| 2008/0224254 | A1 * | 9/2008 | Couillard et al. | 257/506 |
| 2010/0112781 | A1 * | 5/2010 | Yokokawa et al. | 438/458 |
| 2010/0173473 | A1 * | 7/2010 | Jinbo et al. | 438/458 |
| 2011/0223725 | A1 * | 9/2011 | Kang et al. | 438/151 |
| 2011/0316003 | A1 * | 12/2011 | Murphy et al. | 257/77 |
| 2012/0028443 | A1 * | 2/2012 | Cherekdjian et al. | 438/460 |
| 2012/0091587 | A1 * | 4/2012 | Or-Bach et al. | 257/741 |

FOREIGN PATENT DOCUMENTS

| KR | 2000-0061188 A | 10/2000 |
|---|---|---|
| KR | 10-2004-0012916 A | 2/2004 |
| KR | 2004-0080596 A | 9/2004 |
| KR | 10-0803694 B1 | 2/2008 |

* cited by examiner

*Primary Examiner* — Alexander Ghyka
(74) *Attorney, Agent, or Firm* — Muir Patent Consulting, PLLC

(57) ABSTRACT

A conductive layer buried-type substrate is disclosed. The substrate includes a silicon oxidation layer bonded to a supporting substrate, an adhesion promotion layer that is formed on the silicon oxidation layer and improves an adhesion between the silicon oxidation layer and a conductive layer, wherein the conductive layer is formed on the adhesion promotion layer and comprises a metal layer, and a single crystal semiconductor layer formed on the conductive layer.

13 Claims, 17 Drawing Sheets

CONDUCTIVE LAYER BURIED-TYPE SUBSTRATE, METHOD OF FORMING THE CONDUCTIVE LAYER BURIED-TYPE SUBSTRATE, AND METHOD OF FABRICATING SEMICONDUCTOR DEVICE USING THE CONDUCTIVE LAYER BURIED-TYPE SUBSTRATE

CROSS-REFERENCE TO RELATED APPLICATIONS

This application claims the benefit of priority to Korean Patent Application No. 10-2010-0084182, filed on Aug. 30, 2010, in the Korean Intellectual Property Office, the disclosure of which is incorporated herein in its entirety by reference.

BACKGROUND

The disclosed embodiments relate to a substrate, a method of forming a substrate, and a method of fabricating a semiconductor device using the substrate.

In the semiconductor industry, various efforts are performed to increase a driving speed or an integration degree of an integrated circuit device, for example, a semiconductor device. Correspondingly, there is a need to reduce the sizes of transistors that constitute a semiconductor device and reduce a driving voltage.

In order to reduce a driving voltage, a silicon-on-insulator (SOI) substrate (SOI wafer) can be used instead of a bulky silicon substrate. A SOI substrate is formed by using various methods, and generally, a SOI substrate is formed by wafer bonding. In order to increase an integration degree, vertical transistors are formed on a bulky silicon substrate or a SOI substrate.

Regarding the method of forming a SOI substrate by wafer bonding, there is a need for various other modified methods to improve functional characteristics of a semiconductor device. In addition, the method of forming vertical transistors on the SOI substrate also should be optimized.

SUMMARY

The disclosed embodiments provide a substrate having a conductive layer covered by wafer bonding, which is a process used to form a silicon-on-insulator (SOI) substrate.

The disclosed embodiments also provide a method of forming the substrate.

The disclosed embodiments also provide a method of forming a semiconductor device using the substrate.

According to one embodiment, a conductive layer buried-type substrate is disclosed. The substrate includes a silicon oxidation layer bonded to a supporting substrate, an adhesion promotion layer that is formed on the silicon oxidation layer and improves an adhesion between the silicon oxidation layer and a conductive layer, wherein the conductive layer is formed on the adhesion promotion layer and comprises a metal layer, and a single crystal semiconductor layer formed on the conductive layer.

In another embodiment, a method of fabricating a semiconductor device including forming a conductive layer buried-type substrate is disclosed. The method includes forming a hydrogen ion implantation layer by implanting hydrogen ions under a first surface of a single crystal semiconductor substrate, forming a conductive layer comprising a metal layer on the first surface of the single crystal semiconductor substrate, forming an adhesion promotion layer on an upper surface of the conductive layer to improve an adhesion between the conductive layer and a silicon oxidation layer, which is formed after the conductive layer is formed, forming the silicon oxidation layer on an upper surface of the adhesion promotion layer, forming a preliminary conductive layer buried-type substrate by bonding the silicon oxidation layer to a supporting substrate, and forming a conductive layer buried-type substrate comprising a single crystal semiconductor layer on the conductive layer by dividing the single crystal semiconductor substrate along the hydrogen ion implantation layer.

The method may additionally include, for example, forming a plurality of first active structures, each of which comprises a first lower pattern extending in a first direction and a first upper pattern protruding from the first lower pattern and including an array of column-shaped structures, by etching a portion of the single crystal semiconductor layer corresponding to a first region; forming a plurality of buried interconnection lines extending in the first direction by etching the conductive layer between the neighboring first active structures; forming a first gate insulating layer for each of the column-shaped structures, and a first gate electrode on side walls of the column-shaped structures of the first upper pattern, wherein a portion the first upper pattern extends above the first gate electrode; forming a first impurity region electrically connected to the buried interconnection line in the first lower pattern located under the gate electrode; and forming a second impurity region in the first upper pattern located above the gate electrode.

In another embodiment, a semiconductor device is disclosed. The semiconductor device comprises a memory cell array portion including vertical transistors, each coupled to a bit line and a word line, wherein the bit line includes a buried conductive layer connected to an insulation layer by an adhesion promotion layer; and a logic portion including horizontal transistors, each coupled to the same buried conductive layer, insulation layer, and adhesion promotion layer as the vertical transistors in the memory cell array portion.

BRIEF DESCRIPTION OF THE DRAWINGS

Exemplary embodiments will be more clearly understood from the following detailed description taken in conjunction with the accompanying drawings in which.

DETAILED DESCRIPTION OF THE EMBODIMENTS

Figure 1:
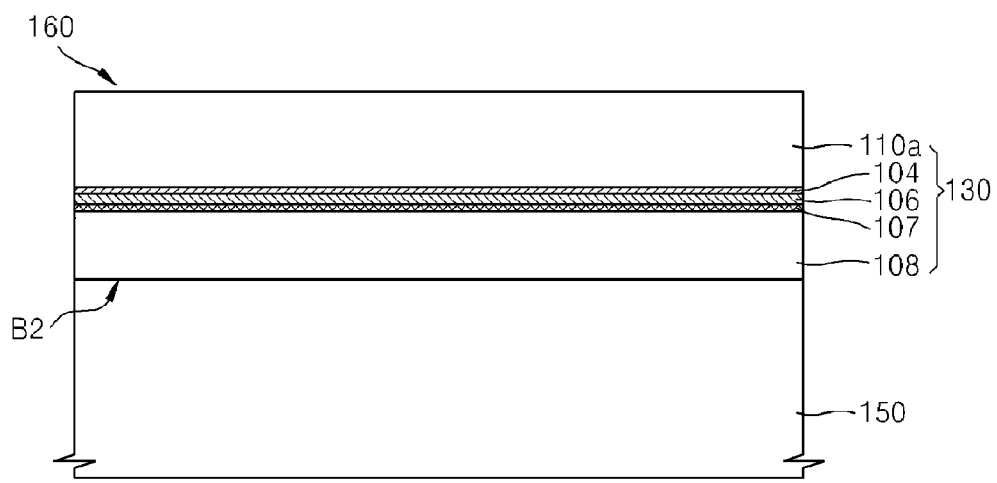
FIG. 1 is a cross-sectional view of a conductive layer buried-type substrate according to an exemplary embodiment.

Reference will now be made in detail to various embodiments, examples of which are illustrated in the accompanying drawings. In this regard, the present embodiments may have different forms and should not be construed as being limited to the descriptions set forth herein. Accordingly, the embodiments are merely described below, by referring to the figures, to explain aspects of the present description. In the drawings, like reference numerals denote like elements. In the drawings, dimensions of structures are enlarged or reduced for clarity.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "includes," "including," "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the specification, it will be understood that when an element is referred to as being 'on' another element, it can be directly on the other element, or intervening elements may also be present. Like reference numerals refer to like elements throughout.

Additionally, the embodiments in the detailed description will be described with sectional views as ideal exemplary views. In the figures, the dimensions of layers and regions are exaggerated for clarity of illustration. Accordingly, shapes of the exemplary views may be modified according to manufacturing techniques and/or allowable errors. Therefore, the embodiments disclosed herein are not limited to the specific shape illustrated in the exemplary views, but may include other shapes that may be created according to manufacturing processes.

Also, though terms like a first, a second, and a third are used to describe various elements, regions, and layers in various embodiments, the elements, regions, and the layers are not limited to these terms. Unless indicated as otherwise, these terms are used only to discriminate one element, region, or layer from another element, region, or layer.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "planar," or "coplanar," as used herein when referring to orientation, location, shapes, sizes, amounts, or other measures do not necessarily mean an exactly identical orientation, location, shape, size, amount, or other measure, but are intended to encompass nearly identical orientation, location, shapes, sizes, amounts, or other measures within acceptable variations that may occur, for example, due to manufacturing processes.

Unless otherwise defined, all terms, including technical and scientific terms, used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view of a conductive layer buried-type substrate 160 according to an exemplary embodiment.

Referring to FIG. 1, conductive layer buried-type substrate 160 may include a supporting substrate 150. The supporting substrate 150 may be a wafer. In one embodiment, the supporting substrate 150 is not a substrate on which devices are substantially formed, so the supporting substrate 150 may not be necessarily a single crystal semiconductor substrate. However, in certain embodiments, semiconductor processes are performed on the supporting substrate 150, so the supporting substrate 150 may be a silicon substrate.

For example, the supporting substrate 150 may be any one of a single crystal silicon substrate, an amorphous silicon substrate, and a polysilicon substrate. When the supporting substrate 150 is a single crystal silicon substrate, the supporting substrate 150 may be allowed to have crystal defects or particles therein. In addition, a low-grade substrate that is inappropriate for forming a device may also be used as the supporting substrate 150.

A structure pattern 130 may be formed on an upper surface of the supporting substrate 150, for example, by direct bonding. In one embodiment, the structure pattern 130 may include a single crystal semiconductor layer 110a, a barrier layer 104 that covers and is deposited on a surface of the single crystal semiconductor layer 110a, a conductive layer 106, an adhesion promotion layer 107, and an insulating layer. The insulating layer may include, for example, a silicon oxidation layer 108.

In one embodiment, the adhesion promotion layer 107 may be formed between the conductive layer 106 and the silicon oxidation layer 108. The adhesion promotion layer 107 may promote and facilitate an adhesion between the conductive layer 106 and the silicon oxidation layer 108. The adhesion promotion layer 107 may be formed, for example, of silicon nitride ($Si_xN_y$), silicon oxynitride ($Si_xO_yN_z$), or a combination thereof. In addition, the adhesion promotion layer 107 may be formed of metal, metal nitride, metal silicide, or a combination thereof.

Furthermore, the adhesion promotion layer 107 may include one or two or more layers of the layers described above. For example, the adhesion promotion layer 107 may include Ti, Co, Ru, Ta, $W_xSi_y$ $Co_xSi_y$, $Ta_xN_y$, $Ti_xN_y$, $W_xN_y$, or a combination thereof, wherein x, y, and z are positive numbers. As such, the adhesion promotion layer 107 may include elements or atoms, e.g., Si, N, O, Ti, Ta, Co, etc., which form a conductive layer (e.g., metal layer) or a silicon oxide (oxidation) layer.

With regard to the conductive layer buried-type substrate 160 according to one embodiment, a surface of the silicon oxidation layer 108 of the structure pattern 130 is bonded to an upper surface B2 of the supporting substrate 150, and the surface of the silicon oxidation layer 108 that is bonded to the upper surface B2 of the supporting substrate 150 is planarized.

Accordingly, as illustrated in FIG. 1, the silicon oxidation layer 108, the adhesion promotion layer 107, the conductive layer 106, the barrier layer 104, and the single crystal semiconductor layer 110a are stacked in that order on the supporting substrate 150. As described above, in the conductive layer buried-type substrate 160 according to one embodiment, the conductive layer 106 that is provided as an interconnection line is interposed between the supporting substrate 150 and the single crystal semiconductor layer 110a.

The single crystal semiconductor layer 110a may be a single crystal silicon layer. A thickness of the single crystal semiconductor layer 110a may be equal to or less than 1 μm. For example, the single crystal semiconductor layer 110a may have a thickness of 1000 to 6000 Å. An upper surface of the single crystal semiconductor layer 110a may have an appropriate degree of planarization. As described above, in one embodiment, since the single crystal semiconductor layer 110a has a thickness equal to or less than 1 μm and a planarized upper surface, the single crystal semiconductor layer 110a is very appropriate to form a semiconductor device for the conductive layer buried-type substrate 160.

The barrier layer 104 is provided as an ohmic contact between the single crystal semiconductor layer 110a and the conductive layer 106. In addition, the barrier layer 104 is provided to prevent metal diffusion. The barrier layer 104 may be formed, for example, of metal, metal nitride, or metal silicide.

Examples of a material that is used to form the barrier layer 104 may include titanium, titanium nitride, tantalum, tantalum nitride, tungsten nitride, tungsten silicide, nickel silicide, and cobalt silicide. The barrier layer 104 may be formed by depositing each or at least two of these materials. In one embodiment, the barrier layer 104 may be formed of a material that is depositable at a temperature, for example, of room temperature (e.g., approximately 25° C.) to 400° C.

The conductive layer 106 may include, for example, a metal material. The conductive layer 106 may be formed of a material that is depositable at a temperature of room temperature to 400° C. In addition, the conductive layer 106 may include metal or metal silicide, each of which has a low resistance. Examples of a material that may be used to form the conductive layer 106 include tungsten, aluminum, copper, tungsten silicide, nickel silicide, and cobalt silicide.

The conductive layer 106 may also be formed of a metal material that is not able to be fusion-bonded to silicon. Thus, the range of metal that can be used to form the conductive layer 106 is very wide. The silicon oxidation layer 108 may be formed of a material that is depositable at a temperature, for example, of room temperature to 400° C. For example, the silicon oxidation layer 108 may include a high density plasma (HDP) oxide, a SOG-based oxide, or a tetra ortho silicate glass (TEOS) layer.

As described above, in the conductive layer buried-type substrate 160 according to the certain embodiments, the barrier layer 104 and the conductive layer 106 are interposed between the supporting substrate 150 and the single crystal semiconductor layer 110a. In addition, the barrier layer 104 and the conductive layer 106 have a low resistance. Thus, the conductive layer buried-type substrate 160 is appropriate for forming a semiconductor device including a buried interconnection line.

FIGS. 2 through 7 are sectional views to explain a method of forming the conductive layer buried-type substrate 160 of FIG. 1, according to certain embodiments.

Figure 2:
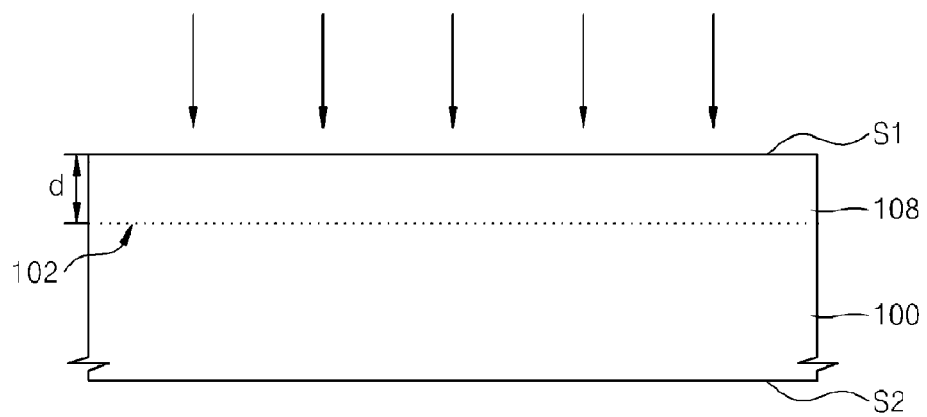
FIGS. 2 through 7 are cross-sectional views to explain a method of forming the conductive layer buried-type substrate of FIG. 1, according to an exemplary embodiment.

Referring to FIG. 2, first, a bonding semiconductor substrate 100 for bonding with a supporting substrate (see 150 of FIG. 5) is prepared. The bonding semiconductor substrate 100 may be, for example, a semiconductor wafer. The bonding semiconductor substrate 100 may be referred to as a device substrate, but hereinafter, the bonding semiconductor substrate 100 will be referred to as a donor substrate.

A portion of the donor substrate 100 may be used as a semiconductor layer for forming a device through a subsequent process. That is, since a device is to be formed on the donor substrate 100, the donor substrate 100 may be, for example, a single crystal semiconductor substrate that does not include crystal defects or particles. The donor substrate 100 may be a single crystal silicon substrate. The donor substrate 100 may include a first surface S1 near a surface of a supporting substrate that is to be bonded, and a second surface S2 opposite the first surface S1.

As indicated by arrows, hydrogen ions are implanted in the donor substrate 100 through the first surface S1. When the hydrogen ions are implanted, a hydrogen ion implantation layer 102 is formed in the donor substrate 100. The hydrogen ion implantation layer 102 is a portion of the donor substrate 100 along which the donor substrate 100 is to be smart-cut. Thus, a depth from the first surface S1 of the donor substrate 100 to the hydrogen ion implantation layer 102 corresponds to a thickness of a single crystal semiconductor layer that is to be formed in a subsequent process.

In an ion implantation process, atomic or molecular ions are accelerated to have sufficient energy to penetrate a surface layer of a target material under a high voltage and the accelerated ions collide with the target material so that the ions are implanted in the target material. Thus, by controlling the intensity of the ion implantation energy used to accelerate ions, a distance d from the first surface S1 of the donor substrate 100 to the hydrogen ion implantation layer 102 is controlled. As described above, by controlling the distance d, the thickness of the single crystal semiconductor layer that is to be formed in a subsequent process may be controlled. In addition, by controlling the amount of ions implanted, an ion distribution in the hydrogen ion implantation layer may be controlled.

If the distance d from the first surface S1 of the donor substrate 100 to the hydrogen ion implantation layer 102 is equal to or greater than 1 μm, the formed single crystal semiconductor layer is thick and it is not easy to fabricate a semiconductor device on the single crystal semiconductor layer. If the distance d from the first surface S1 of the donor substrate 100 to the hydrogen ion implantation layer 102 is equal to or less than 1000 Å, the distance between the first surface S1 of the donor substrate 100 and the hydrogen ion implantation layer 102 is too small and it is difficult to smart-cut the donor substrate 100 at the hydrogen ion implantation layer 102. For example, in one embodiment, the distance d from the first surface S1 of the donor substrate 100 to the hydrogen ion implantation layer 102 may be in the range of 1000 to 6000 Å.

Figure 3:
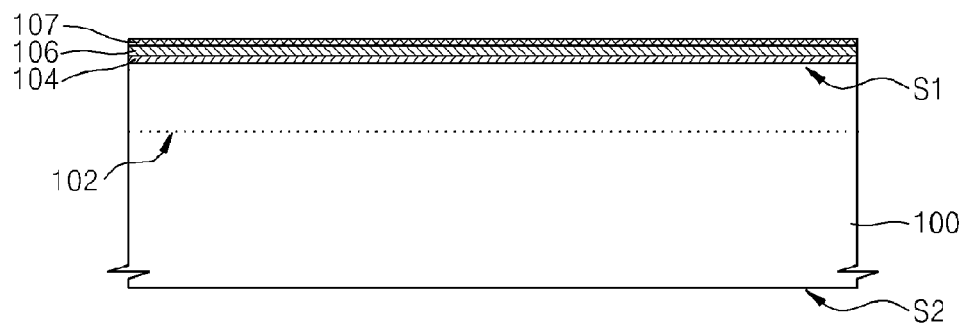

Referring to FIG. 3, the barrier layer 104 is formed on the first surface S1 of the donor substrate 100, covering the first surface S1. The barrier layer 104 may include a material that is depositable, for example, at a temperature of room temperature to 400° C. For example, the barrier layer 104 may be formed of a material that is depositable at a low temperature equal to or lower than 350° C.

If the barrier layer 104 is deposited at a temperature higher than 400° C., the donor substrate 100 may be cut at the hydrogen ion implantation layer 102 and may be divided into two portions. However, as described above, in one embodiment, when the barrier layer 104 is deposited at a temperature equal to or lower than 400 μm, the donor substrate 100 is not cut at the hydrogen ion implantation layer 102.

The barrier layer 104 may be formed, for example, by depositing metal, metal nitride, or metal silicide. For example, the barrier layer 104 may be formed of titanium, titanium nitride, tantalum, tantalum nitride, tungsten nitride, tungsten silicide, cobalt silicide, nickel silicide, or a combination thereof.

The conductive layer 106 may be formed on the barrier layer 104. The conductive layer 106 may include a material that is depositable at a temperature, for example, of room temperature to 400° C. For example, the conductive layer 106 may be formed of a material that is depositable at a low temperature equal to or lower than 350° C. Since the conductive layer 106 is formed at a low temperature as described above, the donor substrate 100 is not cut at the hydrogen ion implantation layer. The conductive layer 106 may be formed, for example, of tungsten, aluminum, copper cobalt, nickel silicide, cobalt silicide, or tungsten silicide.

The adhesion promotion layer 107 may be formed on the conductive layer 106. The adhesion promotion layer 107 is formed to promote and facilitate an adhesion between the conductive layer 106 and a silicon oxidation layer (see 108 of FIG. 4) that is to be formed later. In one embodiment, the adhesion promotion layer 107 may be deposited at a temperature of room temperature to 400° C. If the deposition is performed at a temperature equal to or higher than 400° C., the donor substrate 100 may be cut.

Detailed descriptions of the adhesion promotion layer 107 have been provided above. The adhesion promotion layer 107 may be formed, for example, by treating a conductive layer including a metal layer with ammonia plasma while implanting silane (SiH$_4$) gas in the conductive layer. Alternatively, the adhesion promotion layer 107 may be formed by directly depositing the adhesion promotion materials as described above.

Figure 4:
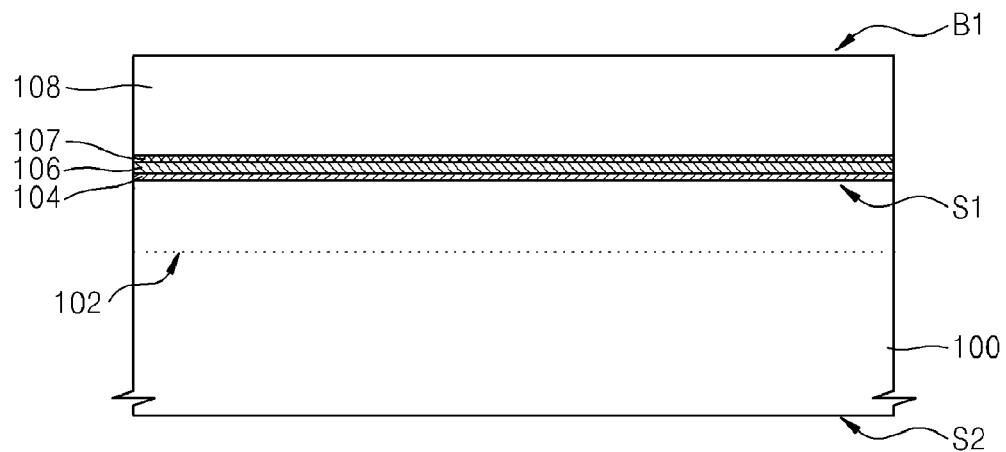

Referring to FIG. 4, the silicon oxidation layer 108 is formed on the adhesion promotion layer 107. The silicon oxidation layer 108 may be deposited at a temperature, for example, of room temperature to 400° C. If the deposition is performed at a temperature equal to or higher than 400° C., the donor substrate 100 may be cut. Accordingly, the silicon oxidation layer 108 may include, for example, an HDP oxidation layer, a SOG oxidation layer, a TEOS layer, or an oxidation layer that is formed by radical oxidation. However, it may be difficult to form the silicon oxidation layer 108 by thermal oxidation, which requires a high temperature. A surface of the silicon oxidation layer 108 corresponds to a contact surface that is to contact a supporting substrate (see 150 of FIG. 5).

By performing the processes as described above, the barrier layer 104, the conductive layer 106, the adhesion promotion layer 107, and the silicon oxidation layer 108 are deposited on the first surface S1 of the donor substrate 100. A surface B1 illustrated in FIG. 4 is the contact surface that is to contact a supporting substrate (see 150 of FIG. 5) in a subsequent process.

Figure 5:
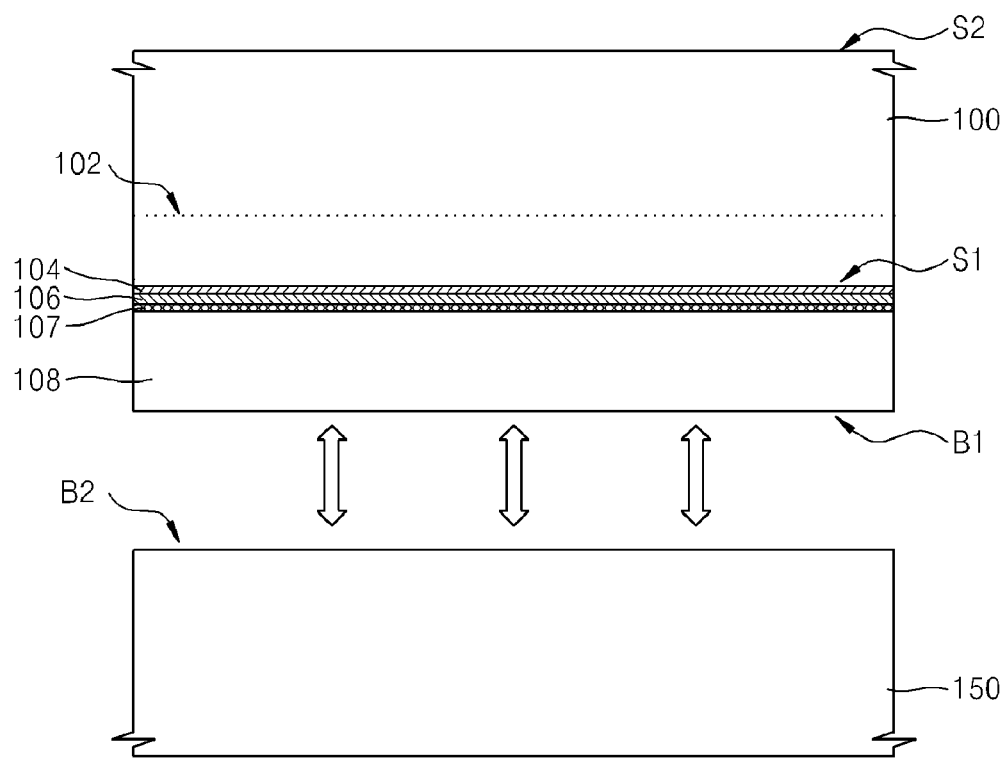
Figure 6:
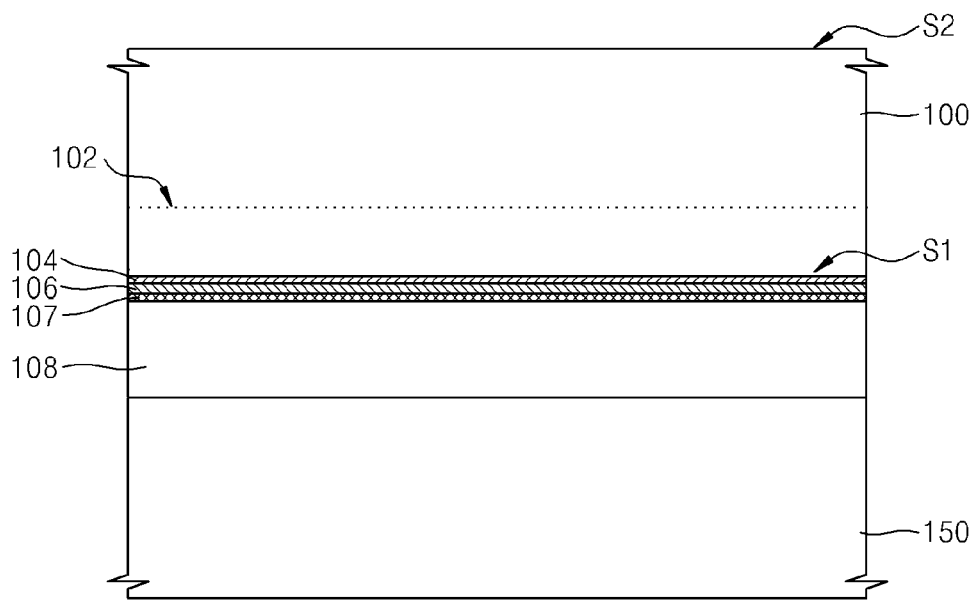

Referring to FIGS. 5 and 6, the supporting substrate 150 for contacting the donor substrate 100 is prepared. The supporting substrate 150 may be, as described in connection with FIG. 1, a silicon substrate. In addition, a low-grade substrate with crystal defects or particles may also be used as the supporting substrate 150.

The supporting substrate 150 is bonded to the silicon oxidation layer 108 of the donor substrate 100. As indicated by arrows illustrated in FIG. 5, the supporting substrate 150 and the donor substrate 100 may be wafer-bonded using the silicon oxidation layer 108. A surface B2 of the supporting substrate 150 is bonded to the donor substrate 100, that is, the surface B1 of the silicon oxidation layer 108.

In one embodiment, to perform the bonding, the surface of supporting substrate 150 and the surface B1 of silicon oxidation layer 108 are hydrophilicized. The hydrophilicizing may be performed by adding water to the supporting substrate 150 and the silicon oxidation layer 108. When the hydrophilicized surface of the supporting substrate 150 contacts the hydrophilicized surface of the silicon oxidation layer 108, the supporting substrate 150 is bonded to the donor substrate 100 due to a Van der Waals force acting between OH groups formed at the contact surface. The bonding may be performed at a temperature of room temperature (e.g., 25° C.) to 400° C. In the present embodiment, the room temperature is a temperature in a clean room, and as described above, may be about 25° C. If the bonding is performed at a temperature of room temperature (25° C.) to 400° C., the donor substrate 100 may not be divided.

In one embodiment, a material that is not appropriate for bonding, such as metal, is not exposed at the contact surface. In a general bonding process, if metal is exposed from any one of a supporting substrate or a donor substrate, due to the metal, it is difficult to finely bond the substrates together without formation of an empty space therebetween. Thus, a contact resistance between the metal and the substrates is increased.

In one embodiment, the supporting substrate 150 is bonded to the surface B1 of the silicon oxidation layer 108 of the donor substrate 100. Since a bonding characteristic of the silicon oxidation layer 108 with respect to the supporting substrate 150 is very good. Accordingly, the two substrates are able to finely bond to each other without formation of an empty space therebetween.

Figure 7:
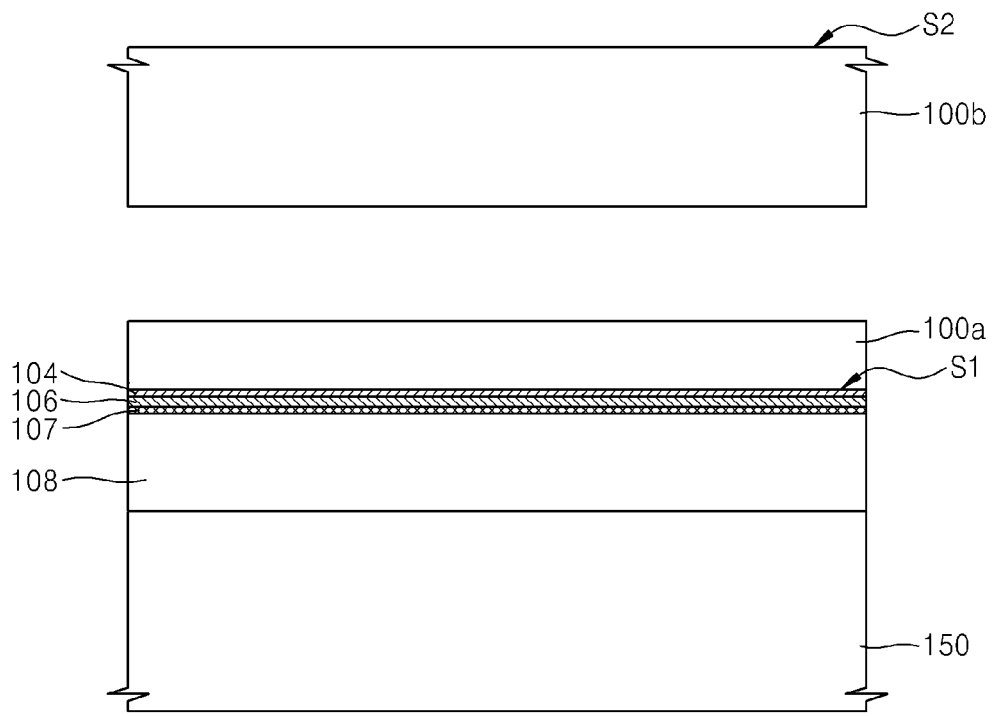

Referring to FIG. 7, the donor substrate 100 is smart-cut along the hydrogen ion implantation layer 102. The smart-cutting may be performed, for example, by thermal treating the donor substrate 100 at a temperature equal to or higher than 400° C. By the smart-cutting, the single crystal semiconductor layer 100a is formed on the barrier layer 104. The single crystal semiconductor layer 100a may have a thickness equal to or less than 1 μm. For example, in one embodiment, the single crystal semiconductor layer 100a may have a thickness of 1000 to 6000 Å.

A second donor substrate 100b that is separate from the donor substrate 100 by smart-cutting may be reused to form another conductive layer buried-type substrate. That is, the second donor substrate 100b may have the same characteristics as the original donor substrate 100 except that a thickness of the second donor substrate 100b is less than that of the original donor substrate 100. Accordingly, in a process of forming a conductive layer buried-type substrate, the second donor substrate 100b separated from the donor substrate 100 by smart-cutting may be reused a few times. Accordingly, the formation costs for a conductive layer buried-type substrate may be lowered.

Figure 8:
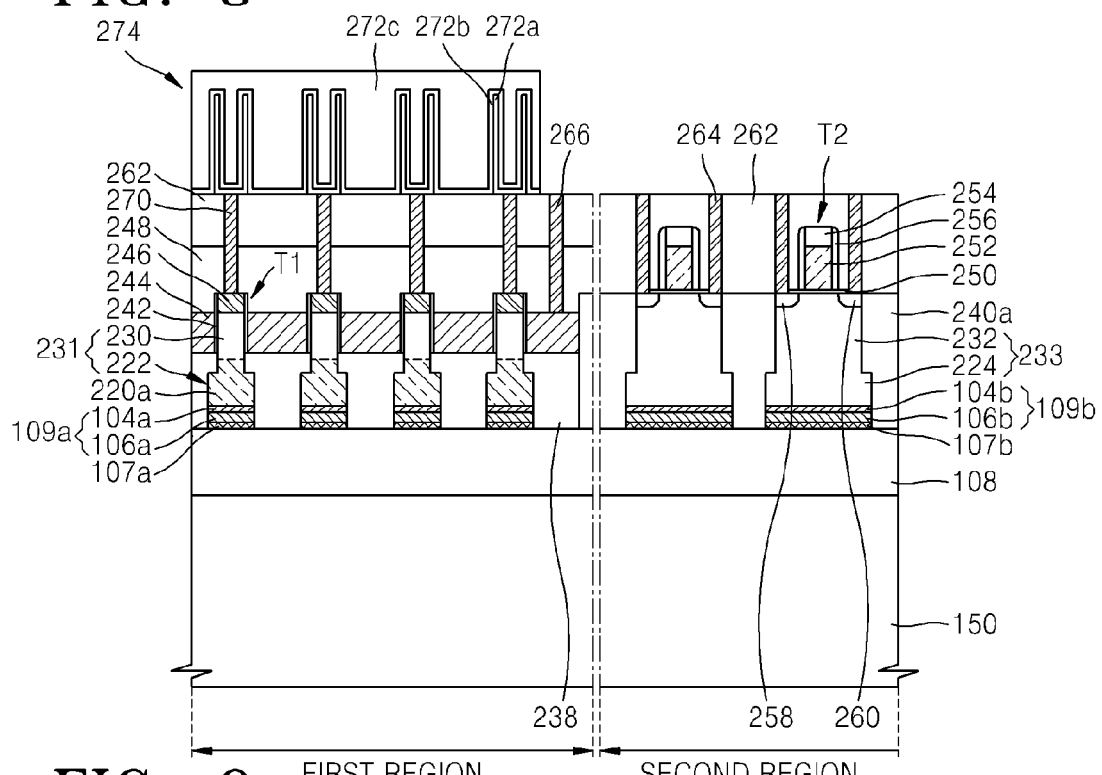
FIGS. 8 and 9 are cross-sectional views of a semiconductor device according to an exemplary embodiment.
Figure 9:
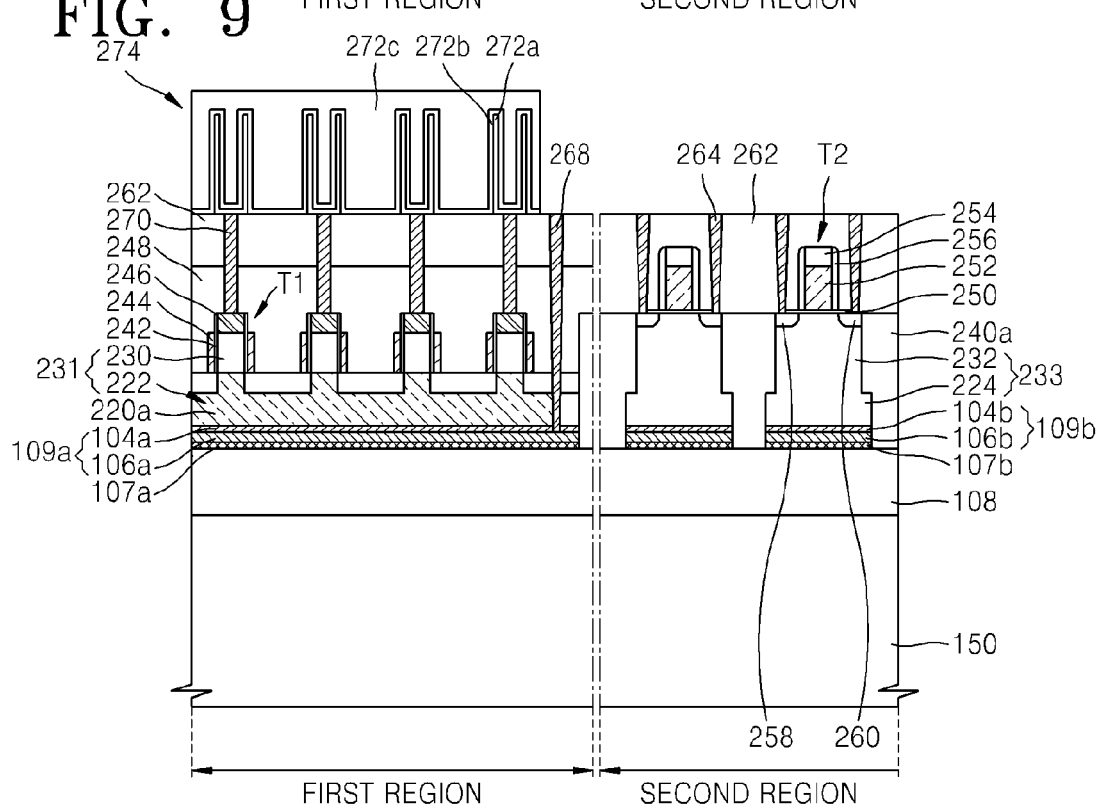
Figure 10:
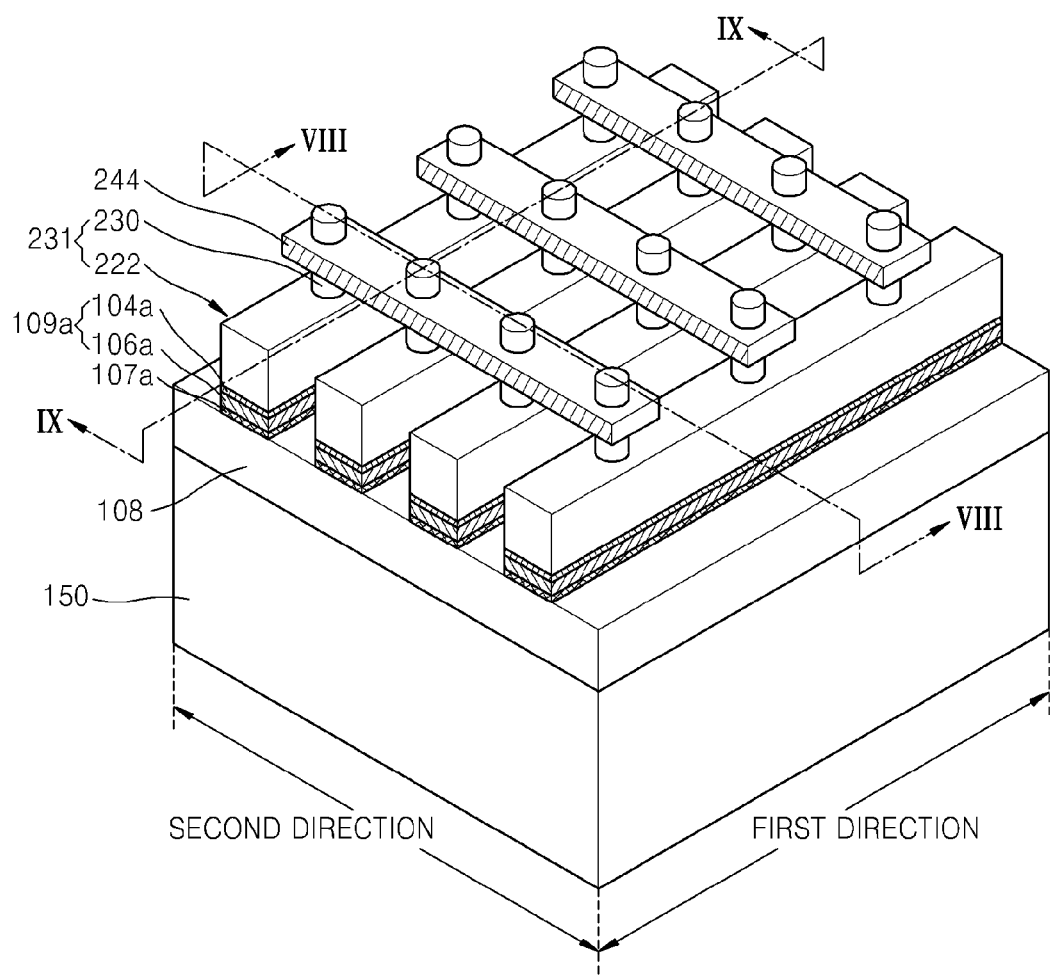
FIG. 10 is a perspective view to explain a method of fabricating the semiconductor device of FIGS. 8 and 9, according to one exemplary embodiment.

FIGS. 8 and 9 are sectional views of a semiconductor device according to an exemplary embodiment, and FIG. 10 is a perspective view to explain a method of fabricating the semiconductor device of FIGS. 8 and 9.

In detail, the semiconductor device according to one embodiment includes a buried interconnection line 109*a*. FIG. 8 is a sectional view taken along a line VIII-VIII of FIG. 10 in a second direction in which a gate electrode extends, and FIG. 9 is a sectional view taken along a line IX-IX of FIG. 10 in a first direction in which a first lower pattern 222 of a first active structure 231 extends.

Referring to FIGS. 8 and 9, the semiconductor device includes a supporting substrate 150, adhesion promotion layer patterns 107*a* and 107*b*, the buried interconnection line 109*a*, the first active structure 231, a second active structure 233, a first transistor T1, a second transistor T2, and a conductive structure 109*b*.

The supporting substrate 150 may be, as described in connection with FIG. 1, a silicon substrate. In addition, a low-grade substrate with crystal defects or particles may also be used as the supporting substrate 150. The supporting substrate 150 may be divided into a first region and a second region. In one embodiment, the first region is a cell region in which memory cells are located, and the second region is a peripheral circuit region in which logic circuits for controlling memory cells are located.

In one embodiment, a silicon oxidation layer 108 is disposed on an upper surface of the supporting substrate 150 by directly bonding. The direct bonding process is able to be employed herein because the silicon oxidation layer 108 is easily bonded to the supporting substrate 150 at a temperature, for example, of room temperature to 400° C. The silicon oxidation layer 108 insulates a single crystal semiconductor layer formed on the silicon oxidation layer 108 from the supporting substrate 150. The silicon oxidation layer 108 may be formed of a material that is depositable at a temperature, for example, equal to or lower than 400° C. The adhesion promotion layer patterns 107*a* and 107*b* for promoting an adhesion to the buried interconnection line 109*a* and the conductive structure 109*b* may be formed on the silicon oxidation layer 108.

In one embodiment, the buried interconnection line 109*a* includes a first conductive layer pattern 106*a* and a first barrier layer pattern 104*a* and is formed on the adhesion promotion layer pattern 107*a* on a portion of the silicon oxidation layer 108 corresponding to the first region. The buried interconnection line 109*a* contacts a lower surface of the first active structure 231 located in the first region. For example, the buried interconnection line 109*a* may be a bit line. As such, the buried interconnection line 109*a* has a line-shape extending in the first direction.

In addition, the conductive structure 109*b* includes a second conductive layer pattern 106*b* and a second barrier layer pattern 104*b* and is formed on the adhesion promotion layer pattern 107*b* on a portion of the silicon oxidation layer 108 corresponding to the second region. The conductive structure 109*b* may contact a lower surface of the second active structure 233 located in the second region. In one embodiment, for example where the second region is a logic region, the conductive structure 109*b* may not substantially function as an interconnection line.

Each of the first and second barrier layer patterns 104*a* and 104*b* may include, for example, metal, metal nitride, or metal silicide. Examples of a material that is used to form the first and second barrier layer patterns 104*a* and 104*b* include titanium, titanium nitride, tantalum, tantalum nitride, tungsten nitride, tungsten silicide, nickel silicide, and cobalt silicide. These materials may be used alone or in combination. Each of the first and second barrier layer patterns 104*a* and 104*b* may include a material that is depositable at a temperature, for example, of room temperature to 400 μm. In addition, the first and second barrier layer patterns 104*a* and 104*b* may include the same material as each other.

In one embodiment, the first and second conductive layer patterns 106*a* and 106*b* may include the same material as each other. The first and second conductive layer patterns 106*a* and 106*b* may include may include a material that is depositable at a temperature, for example, of room temperature to 400° C. The first and second conductive layer patterns 106*a* and 106*b* may include metal or metal silicide, each of which has a low resistance. Examples of a material that is used to form the first and second conductive layer patterns 106*a* and 106*b* include tungsten, aluminum, copper, tungsten silicide, nickel silicide, and cobalt silicide.

The first active structure 231 may be disposed on the buried interconnection line 109*a*. In one embodiment, the first active structure 231 includes the first lower pattern 222 and a first upper pattern 230 contacting an upper surface of the first lower pattern 222. In one embodiment, the first active structure 231 is formed by processing a single crystal semiconductor layer of a buried-type substrate. Thus, the first active structure 231 may include a single crystal semiconductor, for example, a single crystal silicon. In addition, in one embodiment, the total thickness in a vertical direction of the first active structure 231 is less than 1 μm, and may be in the range of 1000 to 6000 Å.

The first lower pattern 222 of the first active structure 231 has a first width and may be disposed on the buried interconnection line 109*a*. The first width of the first lower pattern 222 of the first active structure 231 may be to the same as a width of the buried interconnection line 109*a*. The first lower pattern 222 may extend in a direction that is the same direction in which the buried interconnection line 109*a* extends, for example, the first direction.

The first upper pattern 230 of the first active structure 231 may protrude from the upper surface of the first lower pattern 222 in a direction perpendicular to a surface of the supporting substrate 150 (i.e., in a vertical direction). For example, the first upper pattern 230 may be a cylinder or a polygonal column. According to embodiments of the inventive concept, two or more first upper patterns 230 may be disposed on one first lower pattern 222. The first upper pattern 230 may have a second width narrower than the first width of the first lower pattern 222.

Neighboring first active structures 231 are separated from each other by a first field insulating layer pattern 238 formed on the silicon oxidation layer 108. The first field insulating layer pattern 238 conceals a portion of a gap between neighboring first active structures 231 and a portion of a gap between neighboring buried interconnection lines 109*a* and is located on a portion of the silicon oxidation layer 108 corresponding to the first region. In this regard, an upper surface of the first field insulating layer pattern 238 lies higher than the upper surface of the first lower pattern 222 of the first active structure 231, and lower than an upper surface of the first upper pattern 230.

The first transistor T1 may be disposed on the first active structure 231. The first transistor T1 may include a first gate insulating layer 242, a first gate electrode 244, a first impurity region 220*a*, and a second impurity region 246. Accordingly, in the first transistor T1, a channel is formed in a direction perpendicular to the upper surface of the supporting substrate 150. For example, the first transistor T1 may be a vertical transistor having a channel formed in a direction perpendicular to the upper surface of the supporting substrate 150.

The first gate insulating layer 242 may be formed on a side wall of the first upper pattern 230 of the first active structure 231. For example, the first gate insulating layer 242 may be formed to surround a side wall of the first upper pattern 230 protruding from the first field insulating layer pattern 238. The first gate insulating layer 242 may include, for example, oxide or metal oxide. For example, the first gate insulating layer 242 may include silicon oxide, hafnium oxide (HfOx), aluminum oxide (AlOx), zirconium oxide (ZrOx), or tantalum oxide (TaOx).

The first gate electrode 244 may be disposed on the first field insulating layer pattern 238. That is, the first gate electrode 244 may be formed to surround the side wall of the first upper pattern 230 surrounded by the first gate insulating layer 242. In one embodiment, the first gate electrode 244 may have a line-shape extending in the second direction that is perpendicular to the first direction. In this regard, the first gate electrode 244 may be used as a word line.

The first gate electrode 244 may include, for example, a polysilicon doped with impurities, metal, and/or metal compound. For example, the first gate electrode 244 may include at least one material selected from the group consisting of tungsten (W), titanium (Ti), aluminum (Al), tantalum (Ta), tungsten nitride (WNx), aluminum nitride (AlNx), titanium nitride (TiNx), titanium aluminum nitride (TiAlxNy), tantalum nitride (TaNx), tungsten silicide (WSix), titanium silicide (TiSix), and cobalt silicide (CoSix), in which x is a positive number.

In certain embodiments, the first gate electrode 244 may lie lower than the first active structure 231. That is, the upper surface of the first upper pattern 230 of the first active structure 231 may protrude from the first gate electrode 244.

The first and second impurity regions 220a and 246 may correspond to source and drain regions of the first transistor T1, respectively. For example, the first impurity region 220a may be present in a portion of the first active structure 231 disposed under the first gate electrode 244. The second impurity region 246 may be present in a portion of the first active structure 231 disposed above the first gate electrode 244. In one embodiment, the first and second impurity regions 220a and 246 may have substantially the same impurities.

In embodiments described herein, the first impurity region 220a may extend in a direction that is the same as the direction in which the first lower pattern 222 extends. For example, the first impurity region 220a may have a lower surface contacting an upper surface of the buried interconnection line 109a, and thus, the first impurity region 220a may be electrically connected to the buried interconnection line 109a. In this case, the buried interconnection line 109a with a low resistance is provided as a bit line. Thus, electrical characteristics of the semiconductor device may be improved. The second impurity region 246 may be disposed on the first upper pattern 230.

A first interlayer insulating layer 248 is disposed between neighboring first gate electrodes 244 and on the first field insulating layer pattern 238. The first interlayer insulating layer 248 may be formed, for example, of silicon oxide.

The second active structure 233 may be disposed on the conductive structure 109b disposed in the second region. The second active structure 233 may include a second upper pattern 232 and a second lower pattern 224. Since the second active structure 233 is formed by processing a single crystal semiconductor layer of a buried-type substrate, the second active structure 233 may be formed of the same material used in the first active structure 231.

The conductive structure 109b may be formed by cutting a buried conductive layer to insulate a portion where a device is to be divided in the peripheral circuit region. Thus, the conductive structure 109b contacts a lower surface of the second active structure 233 and is not disposed in a device isolation region.

The second upper pattern 232 of the second active structure 233 may protrude from the second lower pattern 224 upwards away from the supporting substrate 150. The second upper pattern 232 may have a fourth width that is substantially narrower than a third width of the second lower pattern 224.

A second field insulating layer pattern 240a is disposed on the silicon oxidation layer 108 and between neighboring second active structures 233 and between neighboring conductive structures 109b. Thus, the second active structures 233 are electrically separated from each other by the second field insulating layer pattern 240a. The second field insulating layer pattern 240a fills a space between neighboring second active structures 233 and may lie substantially lower than an upper surface of the second upper pattern 232, or substantially on the same plane as the upper surface of the second upper pattern 232. In embodiments, the upper surface of the second upper pattern 232 of the second active structure 233 may be exposed by the second field insulating layer pattern 240a.

In certain embodiments, the second upper pattern 232 of the second active structure 233 may have well regions. Impurities included in the well regions differ according to the type of the second transistor T2 located on the second active structure 233. For example, if the second transistor T2 is a PMOS transistor, the well regions may be doped with N-type impurities.

On the other hand, if the second transistor T2 is an NMOS transistor, the well region may include P-type impurities. When neighboring well regions have different impurities, the doped impurities may migrate between neighboring well regions. However, in the present embodiment, respective second active structures 233 have isolated shapes, and the second field insulating layer pattern 240a fills a space between neighboring second active structures 233. Thus, in this structure, the migration of impurities between neighboring well regions may be effectively blocked.

The second transistor T2 is located on an upper surface of the second active structure 233, and includes a second gate insulating layer 250, a gate mask 254, a second gate electrode 252, a third impurity region 258, and a fourth impurity region 260. The second transistor T2 may have a channel in a direction substantially parallel to the upper surface of the supporting substrate 150. For example, in the second transistor T2, a channel is formed in a direction substantially parallel to the surface of the supporting substrate 150, and a gate spacer 256 may be additionally provided on side walls of the gate mask 254 and the second gate electrode 252.

The second gate insulating layer 250 may be disposed on the second upper pattern 232 of the second active structure 233. The second gate insulating layer 250 may include, for example, an oxide or metal oxide. For example, the second gate insulating layer 250 may include silicon oxide, aluminum oxide, hafnium oxide, tantalum oxide, or zirconium oxide. The second gate insulating layer 250 may include the same material as in the first gate insulating layer 242.

The second gate electrode 252 may be disposed on the second gate insulating layer 250. Like the first gate electrode 242, the second gate electrode 252 may be formed of a doped polysilicon, metal, and/or metal compound. For example, the second gate electrode 252 may be formed of tungsten, titanium, aluminum, tantalum, tungsten nitride, aluminum nitride, titanium nitride, titanium aluminum nitride, tantalum nitride, tungsten silicide, titanium silicide, cobalt silicide, or a combination thereof. The second gate electrode 252 may have a single layer such as a polysilicon layer, a metal layer, or a metal compound layer, or a plurality of layers including a polysilicon layer, a metal layer, and/or a metal compound layer.

The gate mask 254 may be disposed on the second gate electrode 252, and the gate spacer 256 is disposed on the side walls of the gate mask 254 and the second gate electrode 252. The gate mask 254 and the gate spacer 256 may include materials with an etch selectivity with respect to the second active structure 233 and an interlayer insulating layer, respectively. For example, each of the gate mask 254 and the gate spacer 256 may include nitride, such as silicon nitride, or oxynitride, such as silicon oxynitride.

The third and fourth impurity regions 258 and 260 are formed under the upper surface of the second upper pattern 232 at both sides of the second gate electrode 252. The third and fourth impurity regions 258 and 260 may function as the source and drain regions of the second transistor T2. The third and fourth impurity regions 258 and 260 may include substantially the same impurities as used in the first and second impurity regions 220a and 246, respectively.

A second interlayer insulating layer 262 is formed to cover the first active structure 231, the second active structure 233, the first transistor T1, and the second transistor T2. That is, the second interlayer insulating layer 262 may be formed on the first active structure 231, the second active structure 233, the first interlayer insulating layer 248, and the second field insulating layer pattern 240a.

The second interlayer insulating layer 262 may include, for example, oxide such as silicon oxide. For example, the second interlayer insulating layer 262 may include BPSG, phosphosilicate glass (PSG), SOG, un-doped silicate glass (USG), flowable oxide (FOX), fluoride silicate glass (FSG), TEOS, plasma enhanced TEOS (PE-TEOS), or HDP chemical vapor deposition (HDP-CVD) oxide. In addition, the second interlayer insulating layer 262 may include a leveled upper surface that is formed through a planarization process.

In one embodiment, a plurality of contacts are formed to penetrate the second interlayer insulating layer 262 and the first interlayer insulating layer 248. For example, first contacts 264 contact each of third and fourth impurity regions 258 and 260 in the second region, a second contact 266 contacts the first gate electrode 244 in the first region, a third contact 268 contacts the buried interconnection line 109a in the first region, and the fourth contacts 270 contact the upper surface of the first upper pattern 230.

In one embodiment, a capacitor 274 may be electrically connected to the second impurity region 246. That is, the capacitor 274 may be electrically connected to the second impurity region 246 via the fourth contacts 270. In the capacitor 274, a lower electrode 272a may have a cylinder-shape as illustrated. However, instead, the lower electrode 272a of the capacitor 274 may have a stack shape.

In semiconductor devices according to embodiments of the inventive concept, due to the presence of the buried interconnection line 109a capable of functioning as a bit line under the first active structure 231, a low-resistance and highly integrated semiconductor device may be manufactured. In particular, the buried interconnection line 109a has a low contact resistance due to the inclusion of the first barrier layer pattern 104a and the first conductive layer pattern 106a including metal.

In addition, since neighboring first and second active structures 231 and 233 are electrically isolated by the first and second field insulating layer patterns 238 and 240a and an insulating layer is formed under the first and second active structures 231 and 233, the occurrence of a P-N junction between well regions in a cell region and a logic region of a semiconductor device may be prevented. Thus, electrical characteristics and reliability of a semiconductor device may be significantly improved. Furthermore, because the first and second active structures 231 and 233 have small heights, a semiconductor device may have a stable structure.

FIGS. 11 through 23 are cross-sectional views to explain a method of fabricating the semiconductor device of FIGS. 8 and 9, according to one exemplary embodiment.

In one embodiment, the semiconductor device is fabricated using the conductive layer buried-type substrate 160 illustrated in FIG. 1. First, the conductive layer buried-type substrate 160 illustrated in FIG. 1 is formed by performing the processes described with reference to FIGS. 2 through 7.

Figure 11:
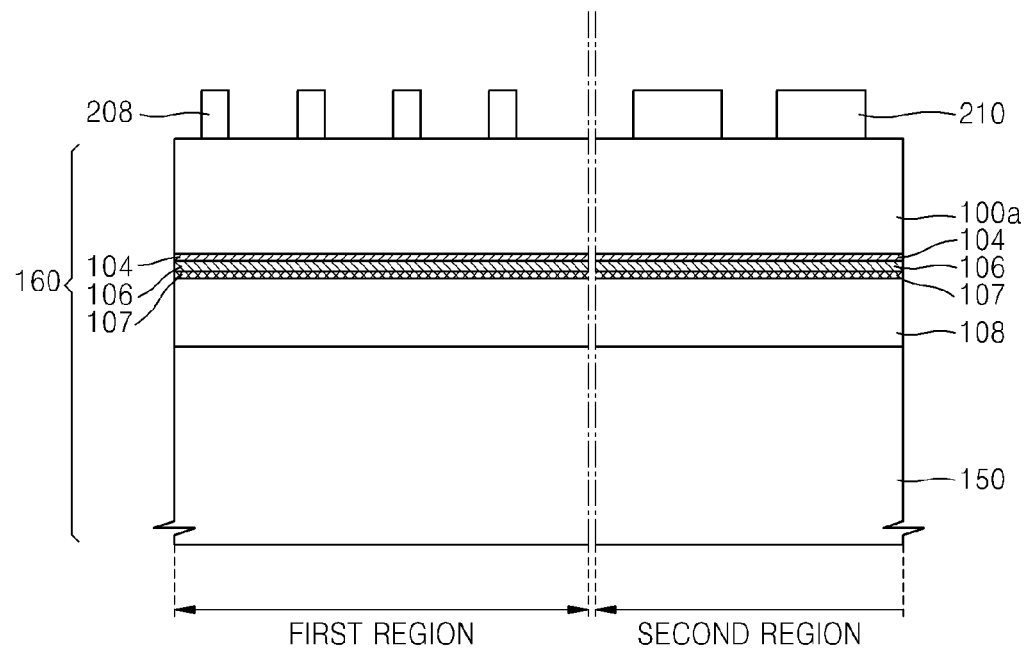
FIGS. 11 through 23 are cross-sectional views to explain the method of fabricating the semiconductor device of FIGS. 8 and 9, according to an embodiment.

Referring to FIG. 11, first and second mask patterns 208 and 210 are formed on the single crystal semiconductor layer 100a included in the conductive layer buried-type substrate 160. The first mask pattern 208 is provided to pattern a portion of the first active structure 231, and the second mask pattern 210 is provided to pattern a portion of the second active structure 233. In certain embodiments, the first mask pattern 208 may have a line-shape extending in the first direction (as shown in FIG. 10). The second mask pattern 210 may have a shape of the upper surface of the second active structure 233 for embodying a peripheral circuit.

The first and second mask patterns 208 and 210 may be formed using a material with an etch selectivity to the single crystal semiconductor layer 100a. For example, the first and second mask patterns 208 and 210 may be formed of oxide, nitride, or oxynitride.

Figure 12:
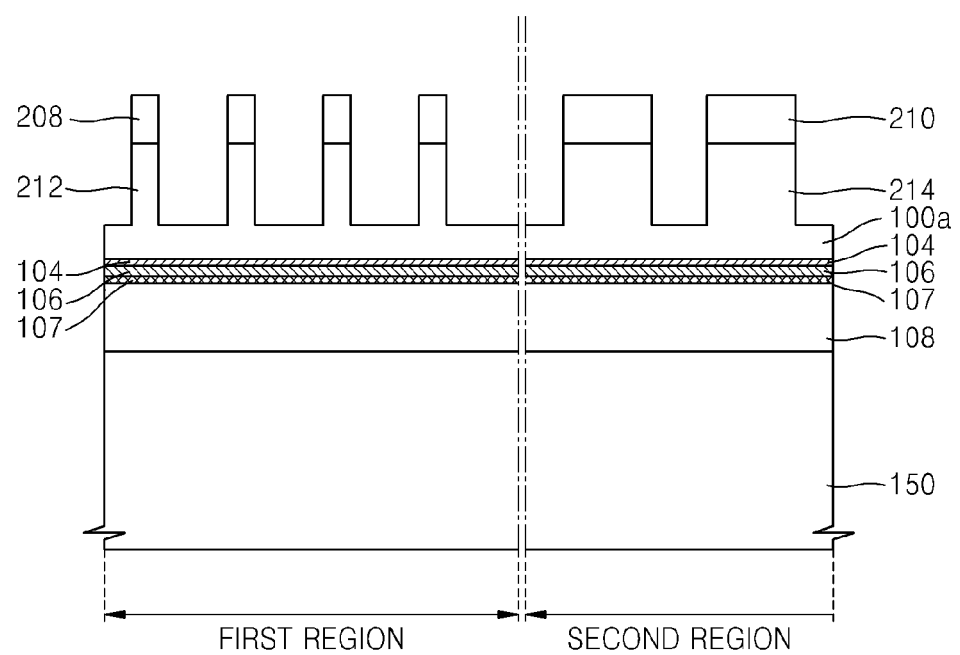

Referring to FIG. 12, portions of the single crystal semiconductor layer 100a are etched using the first and second mask patterns 208 and 210 as etch masks to form a preliminary first upper pattern 212 and a preliminary second upper pattern 214. For example, the preliminary first upper pattern 212 and the preliminary second upper pattern 214 may be formed by performing an anisotropic etch process. The preliminary first upper pattern 212 may have a line-shape extending in the first direction, corresponding to the shape of the first mask pattern 208.

Figure 13:
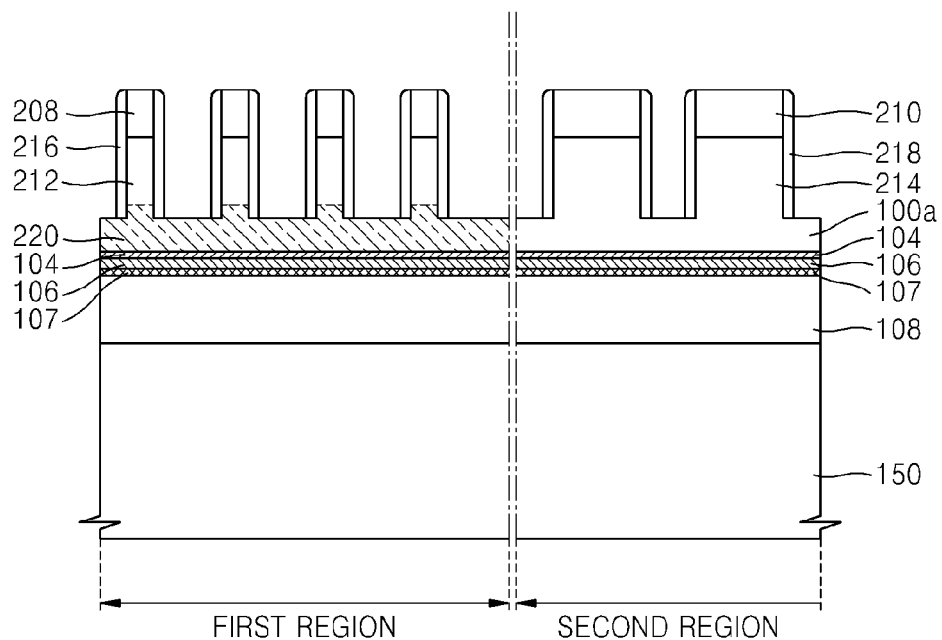

Referring to FIG. 13, a first spacer 216 is formed on side walls of the first mask pattern 208 and the preliminary first upper pattern 212. A second spacer 218 is formed on side walls of the second mask pattern 210 and the preliminary second upper pattern 214.

According to an embodiment, a spacer layer (not shown) may be formed along surfaces of the first mask pattern 208, the preliminary first upper pattern 212, the second mask pattern 210, and the preliminary second upper pattern 214. The spacer layer may be formed, for example, by depositing a silicon oxidation layer or a silicon nitride layer. As described above, by depositing a material with an etch selectivity, such as silicon oxidation or silicon nitride, only the spacer layer is removed in a subsequent process. Thereafter, the spacer layer is anisotropically etched to expose portions of the single crystal semiconductor layer 100a between neighboring preliminary first upper patterns 212 and neighboring preliminary second upper patterns 214. Hence, first and second spacers 216 and 218 are formed.

A preliminary first impurity region 220 is formed by implanting first impurities through a surface of the single crystal semiconductor layer 100a between the preliminary first upper patterns 212. The first impurities may include P-type impurities or N-type impurities. For example, in one embodiment, the first impurities include N-type impurities. In this regard, the first impurities are not implanted in a portion of the preliminary first upper pattern 212 covered by the first spacer 216. However, as illustrated, the first impurities may be able to diffuse to a lower portion of the preliminary first upper pattern 212 from the surface of the single crystal semiconductor layer 100a.

In the process for implanting the first impurities, by controlling an ion implantation depth of the first impurities, a lower surface of the preliminary first impurity region 220 may be formed to contact a lower surface of the single crystal semiconductor layer 100a. In this case, the preliminary first impurity region 220 may be electrically connected to the barrier layer 104 and the conductive layer 106 under the single crystal semiconductor layer 100a.

Figure 14:
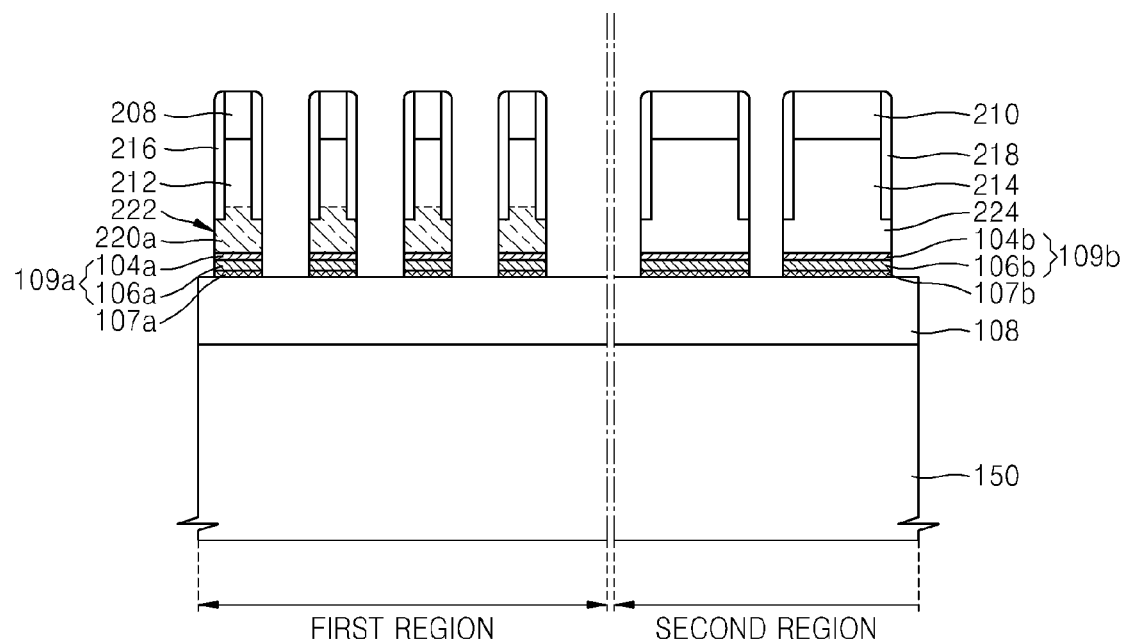

Referring to FIG. 14, exposed portions of the single crystal semiconductor layer 100a are anisotropically etched using the first mask pattern 208, the second mask pattern 210, the first spacer 216, and the second spacer 218 as etch masks. Through the process as described above, the first lower pattern 222 and the second lower pattern 224 respectively included in the first and second active structures 231 and 233 are formed. The first lower pattern 222 is formed under the preliminary first upper pattern 212, and the second lower pattern 224 is formed under the preliminary second upper pattern 214. During the etch process for forming the first and second lower patterns 222 and 224, a portion of the preliminary first impurity region 220 is also etched to form the first impurity region 220a in the first lower pattern 222.

The first impurity region 220a may function as a source/drain region of the first transistor T1, which will be formed in a subsequent process. In certain embodiments, the first lower pattern 222 may have a line-shape extending in a direction substantially parallel to the first direction, corresponding to the structures of the first mask pattern 208 and the first spacer 216. Also, the second lower pattern 224 may have an isolated shape corresponding to the shapes of the second mask pattern 210 and the second spacer 218.

Subsequently, exposed portions of the barrier layer 104, the conductive layer 106, and the adhesion promotion layer 107 are sequentially etched, thereby forming the buried interconnection line 109a, the conductive structure 109b, and the adhesion promotion layer patterns 107a and 107b. The buried interconnection line 109a and the conductive structure 109b are disposed under the first and second active structures 231 and 233, respectively. That is, the buried interconnection line 109a is located between the first lower pattern 222 and the portion of the silicon oxidation layer 108 corresponding to the first region, and the conductive structure 109b is located between the second lower pattern 224 and the portion of the silicon oxidation layer 108 corresponding to the second region.

According to certain embodiments, the buried interconnection line 109a may have substantially the same width as the first lower pattern 222, and may extend in the first direction. As described above, the buried interconnection line 109a may function as a buried bit line, and may be electrically connected to the first impurity region 220a. The conductive structure 109b may have substantially the same width as the second lower pattern 224 of the second active structure 233.

Since the buried interconnection line 109a includes the first barrier layer pattern 104a, contact characteristics with respect to the first conductive layer pattern 106a are excellent, and metal diffusion in the first conductive layer pattern 106a may be prevented. In addition, since the first conductive layer pattern 106a includes metal with low resistance, a contact resistance between the buried interconnection line 109a and the first impurity region 220a is very low.

Figure 15:
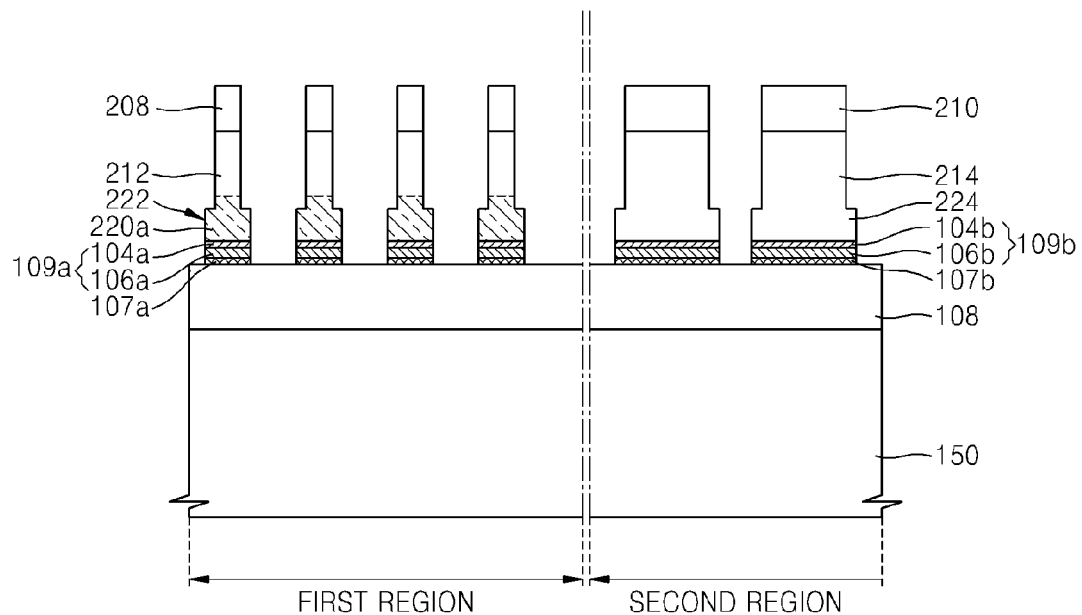

Referring to FIG. 15, in a subsequent process, first spacer 216 and second spacer 218 may be removed, thereby exposing part of the sidewalls and a top portion of first and second lower patterns 222 and 224, and exposing sidewalls of first and second upper patterns 212 and 214.

Figure 16:
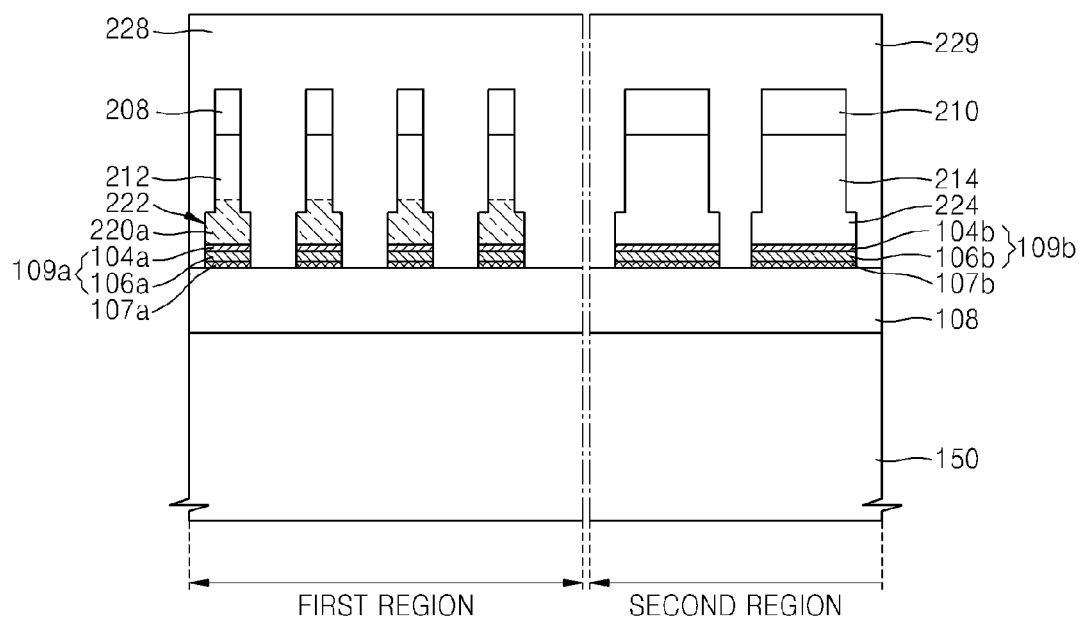

Referring to FIG. 16, a third mask pattern 228 with a line-shape extending in the second direction that is perpendicular to the first direction is formed on an upper surface of the first mask pattern 208 and a side wall of the first upper pattern 212. In addition, in the second region, a fourth mask pattern 229 is formed according to the shape of the second active structure 233 in the peripheral circuit region. For example, the fourth mask pattern 229 may entirely cover the second region. The third and fourth mask patterns 228 and 229 may be photoresist patterns. In one embodiment, the third mask pattern 228 may expose a portion of the first mask pattern 208.

Figure 17:
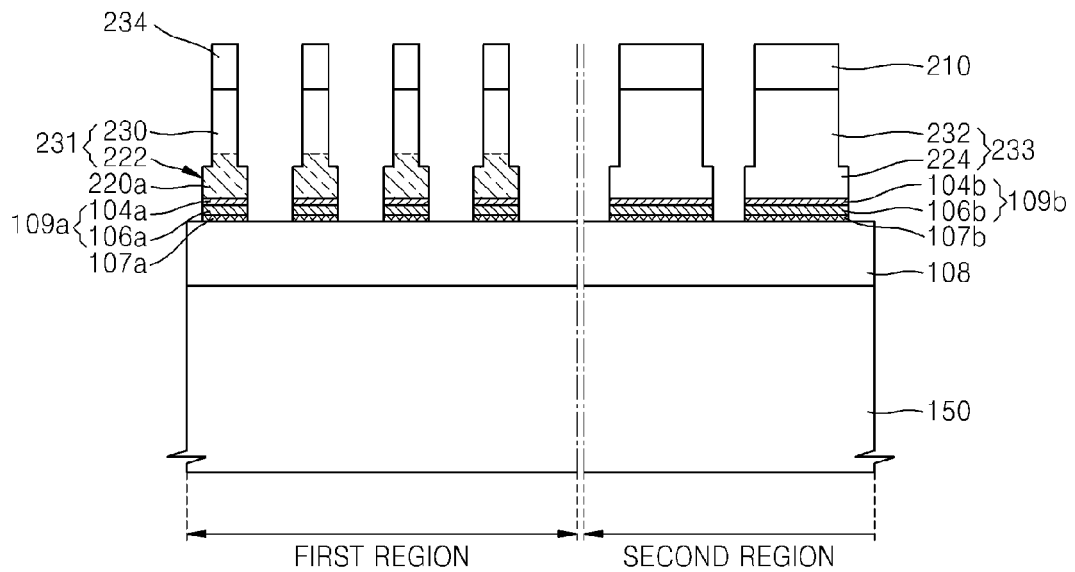

Referring to FIG. 17, the exposed portion of the first mask pattern 208 is etched using the third and fourth mask patterns 228 and 229 as etch masks. By performing this etching process, the first mask pattern 208 becomes a fifth mask pattern 234 with a cylindrical or polygonal column-shape.

Subsequently, by using the fifth mask pattern 234, an exposed portion of the preliminary first upper pattern 212 is etched. By doing so, the first upper pattern 230 with a cylindrical or polygonal column-shape is formed on the first lower pattern 222. In this regard, a plurality of the first upper patterns 230 may be regularly aligned and spaced from each other on the first lower patterns 222 with the line-shape extending in the first direction. That is, a pattern such as shown in FIG. 10, having a plurality of parallel lower bar-shaped structures (222) extending in the first direction, and on each of those structures, a plurality of columnar-shaped structures (e.g., cylindrical or polygonal column) are formed. The columns may form an array extending in the first and second direction.

Thus, the first active structure 231, including the first upper pattern 230 and the first lower pattern 222, is formed in the first region, and the second active structure 233, including the second upper pattern 232 and the second lower pattern 224, is formed in the second region.

As described above, the first width of the first lower pattern 222 may be wider than the second width of the first upper pattern 230, and the third width of the second lower pattern 224 may be wider than the fourth width of the second upper pattern 232. In addition, the third width of the second lower pattern 224 may be wider than the first width of the first lower pattern 222. Thus, each of the first and second active structures 231 and 233 may have a tiered shape.

Figure 18:
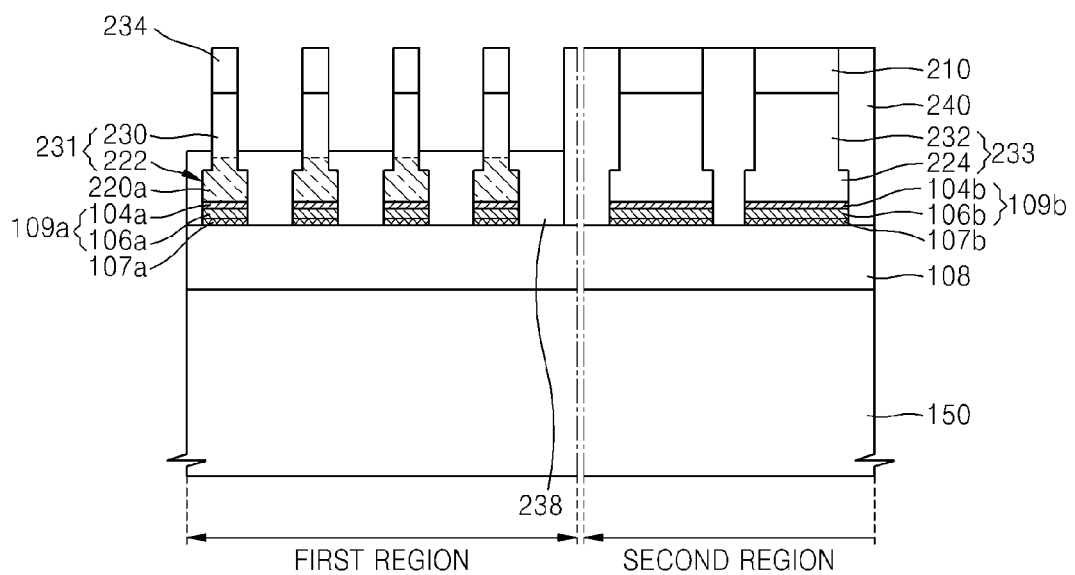

Referring to FIG. 18, the first field insulating layer pattern 238 and a preliminary second field insulating layer pattern 240 may be formed on the silicon oxidation layer 108. The first field insulating layer pattern 238 is formed in the first region, and the preliminary second field insulating layer pattern 240 is formed in the second region.

The first field insulating layer pattern 238 may be formed to fill a portion of a gap between neighboring first active structures 231 in the first region. For example, the first field insulating layer pattern 238 fills a gap between neighboring first lower patterns 222 of the first active structure 231 and a gap between lower portions of neighboring first upper patterns 230. As a result, in one embodiment, the first impurity region 220a may be covered by the first field insulating layer pattern 238. Thus, an upper boundary of the first field insulating layer pattern 238 may lie higher than the first lower pattern 222 and lower than the upper surface of the first upper pattern 230. Accordingly, when the first field insulating layer pattern 238 is formed, an upper portion of the first upper pattern 230 protrudes upwards from the first field insulating layer pattern 238.

The preliminary second field insulating layer pattern 240 may be formed to completely fill a space between neighboring second active structures 233 in the second region. In this regard, an upper surface of the second mask pattern 210 formed on the second active structure 233 may be exposed by the preliminary second field insulating layer pattern 240. That is, an upper surface of the preliminary second field insulating layer pattern 240 and the upper surface of the second mask pattern 210 may lie on the same plane. According to one embodiment, the upper surface of the preliminary second field insulating layer pattern 240 and the upper surface of the second active structure 233 may not lie on the same plane. In this regard, the second mask pattern 210 may protrude upwards within the preliminary second field insulating layer pattern 240.

In processes for forming the first field insulating layer pattern 238 and the preliminary second field insulating layer pattern 240 according to certain embodiments, first, a field insulating layer covering the fifth and second mask patterns 234 and 210 is formed on the silicon oxidation layer 108. The field insulating layer may be formed of oxide such as silicon oxide. For example, the field insulating layer may be formed of USG, BPSG, PSG, FOX, TEOS, PE-TEOS, SOG, TOSZ, or FSG.

Subsequently, the field insulating layer is removed until upper surfaces of the fifth and second mask patterns 234 and 210 are exposed, thereby forming the preliminary second field insulating layer pattern 240 in the second region. Then, a part of a portion of the field insulating layer corresponding to the first region is etched, thereby exposing a portion of the first upper pattern 230 of the first active structure 231 and forming the first field insulating layer pattern 238.

Figure 19:
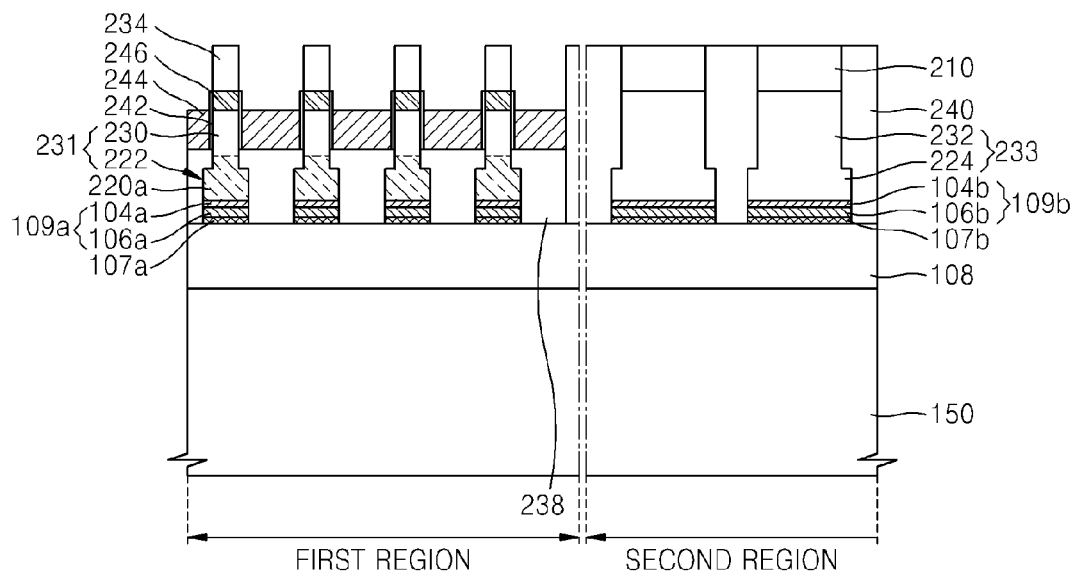

Referring to FIG. 19, the first gate insulating layer 242 may be formed on an upper side wall of the first upper pattern 230 exposed by the first field insulating layer pattern 238. The first gate insulating layer 242 insulates the first upper pattern 230 from the first gate electrode 244 that is formed after the first upper pattern 230 is formed. For example, the first gate insulating layer 242 may be formed to surround the upper side wall of the first upper pattern 230. That is, the first gate insulating layer 242 may surround a portion of sidewalls of each column in an array of columns in the first upper pattern 230.

The first gate insulating layer 242 may be formed, for example, of silicon oxide or metal oxide. For example, the first gate insulating layer 242 may be formed of aluminum oxide, hafnium oxide, or zirconium oxide. In addition, the first gate insulating layer 242 may be formed by processes such as thermal oxidation, chemical vapor deposition, atomic layer deposition, or sputtering.

Then, a second conductive layer (not shown) covering the first active structure 231 is formed on the first field insulating layer pattern 238. The second conductive layer may be formed, for example, of polysilicon doped with impurities, metal, and/or metal compound. For example, the second conductive layer may be formed of tungsten (W), titanium (Ti), tantalum (Ta), aluminum (Al), aluminum nitride (AlNx), tungsten nitride (WNx), titanium nitride (TiNx), titanium aluminum nitride (TiAlNx), tantalum nitride (TaNx), or a combination thereof. Then, the second conductive layer is blanket etched to expose upper surfaces of the fourth and fifth mask patterns. By doing so, the second conductive layer may remain only in the first region.

A sixth mask pattern (not shown) is then formed on the second conductive layer. The sixth mask pattern may have a line shape extending in the second direction. By etching the second conductive layer by using the sixth mask pattern as an etch mask, the first gate electrode 244 is formed on the first field insulating layer pattern 238. The first gate electrode 244 may have a line shape extending in the second direction. The first gate electrode 244 may be formed to surround the side wall of the first upper pattern 212. In addition, the first gate electrode 244 may lie substantially lower than a top of the first upper pattern 230 of the first active structure 231. Thus, a portion of the upper portion of the first upper pattern 230 may be exposed above the first gate electrode 244.

Figure 20:
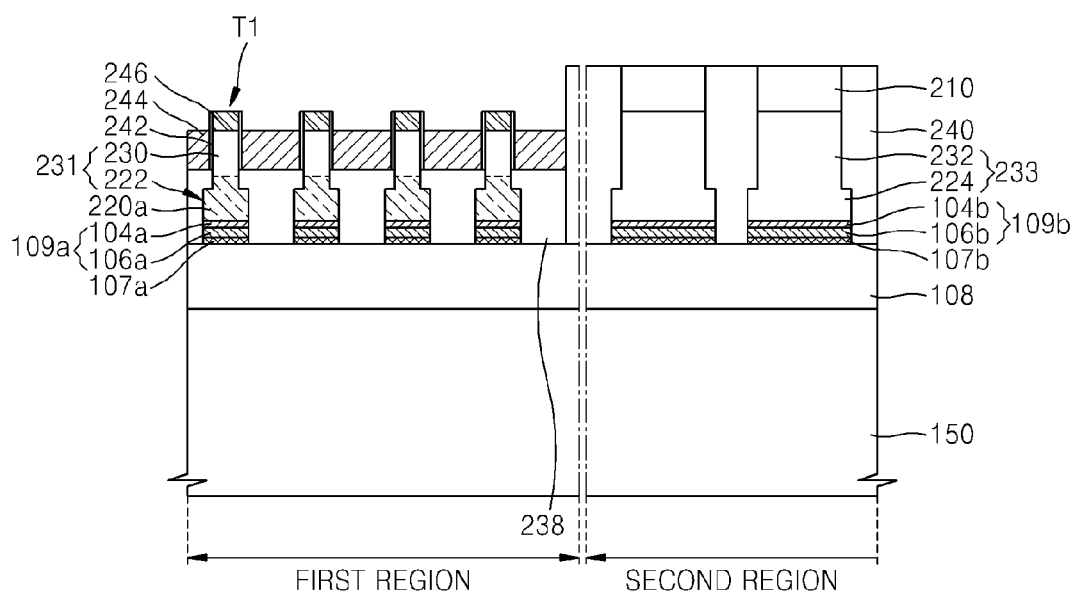

Referring to FIG. 20, the fifth mask pattern 234 in the first region is removed to expose the upper surface of the first upper pattern 230 of the first active structure 231. In this case, the second mask pattern 210 in the second region may not be removed. By performing this process, the structure as illustrated in FIG. 10 is completely formed in the first region.

The second impurity region 246 is formed by implanting second impurities in the exposed upper portion of the first upper pattern 230. The first transistor T1 in the second impurity region 246 may function as a source/drain region. The second impurities in the second impurity region 246 may be substantially the same as the first impurities in the first impurity region 220a.

Once the second impurity region 246 is formed, the first active structure 231 and the first transistor T1 are completely formed on the portion of the silicon oxidation layer 108 corresponding to the first region. The first transistor T1 may include the first gate insulating layer 242, the first gate electrode 244, the first impurity region 220a, and the second impurity region 246. Since the first transistor T1 includes the first impurity region 220a located under the first gate electrode 244 and the second impurity region 246 located above the first gate electrode 244, a channel may be formed to extend in a direction substantially perpendicular to the surface of the supporting substrate 150. Thus, the first transistor T1 may correspond to a vertical channel transistor. In the first transistor T1, the first impurity region 220a may be electrically connected to a buried interconnection line under the first impurity region 220a. The buried interconnection line can serve as a bit line.

Figure 21:
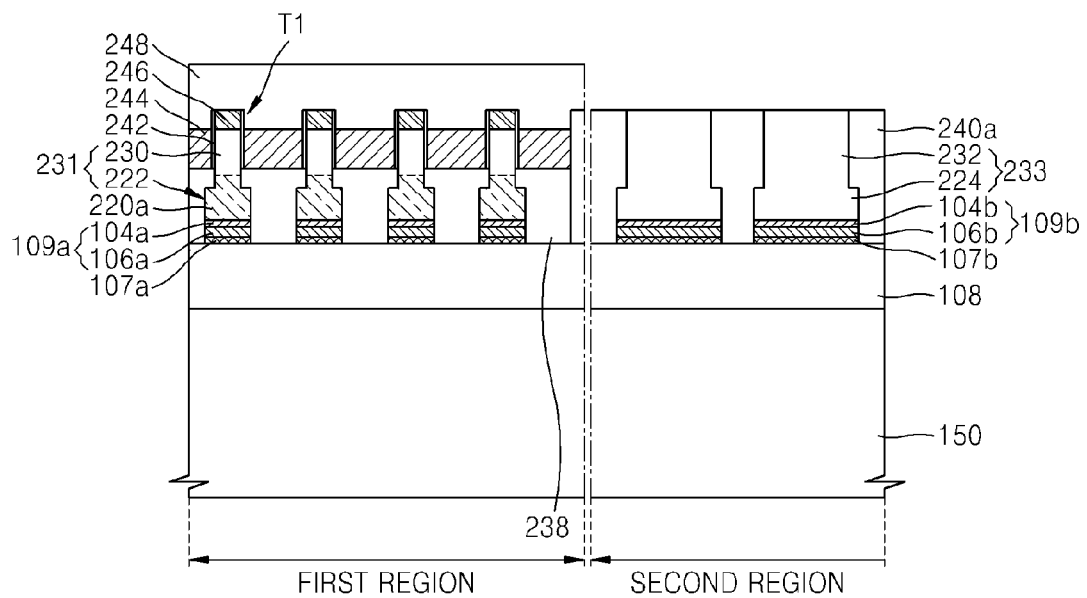

Referring to FIG. 21, the first interlayer insulating layer 248 is formed in the first and second region. In addition, the first interlayer insulating layer 248 is polished to expose an upper surface of the fourth mask pattern. Thus, the first active structure 231 formed in the first region is covered by the first interlayer insulating layer 248.

Subsequently, after the second mask pattern 210 in the second region is removed, a portion of the preliminary second field insulating layer pattern 240 is removed to form the second field insulating layer pattern 240a. Once the second field insulating layer pattern 240a is formed, an upper surface of the second upper pattern 232 of the second active structure 233 is exposed.

Figure 22:
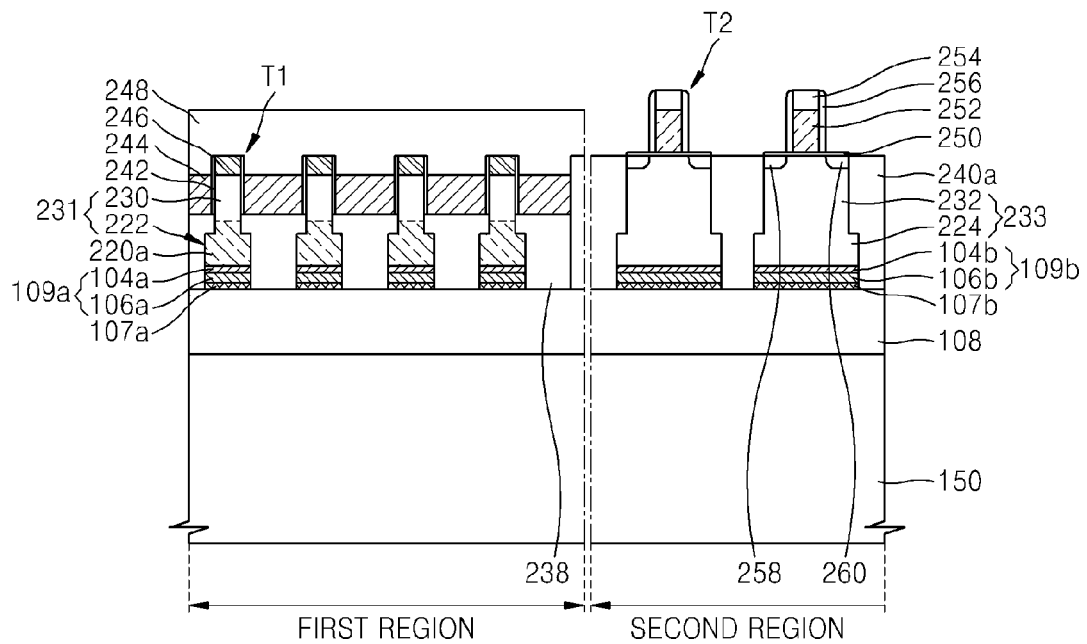

Referring to FIG. 22, the second gate insulating layer 250 is formed on the exposed upper surface of the second upper pattern 232 of the second active structure 233. Like the first gate insulating layer 242, the second gate insulating layer 250 may be formed of silicon oxide or metal oxide. The second gate insulating layer 250 may be formed by a process such as thermal oxidation, chemical vapor deposition, atomic layer deposition, or sputtering. In one embodiment, the second gate insulating layer 250 and the first gate insulating layer 242 may be formed of the same material.

A third conductive layer (not shown) is formed on the second gate insulating layer 250. The third conductive layer may be formed, for example, of polysilicon doped with impurities, metal, and/or metal compound. For example, the third conductive layer may be formed of tungsten, titanium, tantalum, aluminum, tungsten nitride, titanium nitride, aluminum nitride, tantalum nitride, or a combination thereof.

After the gate mask 254 is formed on the third conductive layer, the third conductive layer is patterned using the gate mask 254 as an etch mask to form the second gate electrode 252 on the second gate insulating layer 250. In this regard, the second gate electrode 252 may extend in a direction parallel to the first direction. The gate mask 254 may be formed of a material with an etch selectivity to the second field insulating layer pattern 240a and the second active structure 233, such as silicon nitride or silicon oxynitride.

In one embodiment, the gate spacer 256 is formed on side walls of the gate mask 254 and the second gate electrode 252. The gate spacer 256 may be formed, for example, of nitride, such as silicon nitride, or oxynitride, such as silicon oxynitride.

The third impurity region 258 and the fourth impurity region 260 are formed by implanting third impurities in the second upper pattern 232 located adjacent to the second gate electrode 252 by using the second gate electrode 252 and the gate spacer 256 as etch masks. The third and fourth impurity regions 258 and 260 may be formed in portions of the preliminary second upper pattern 214 on sides of the second gate electrode 252, respectively. Thus, the second transistor T2 including the second gate insulating layer 250, the second gate electrode 252, the third impurity region 258, and the fourth impurity region 260 may be provided in the second region. The second transistor T2 may be referred to as a "horizontal" transistor, because the source and drain regions are disposed on a same horizontal plane and current flows in a horizontal direction, as opposed the first transistor T1, which may be referred to as a "vertical" transistor.

In embodiments of the inventive concept, if a well region is a P-type well region, the third impurities may include N-type impurities. In this regard, the second transistor T2 formed in the P-type well region may be an NMOS transistor. According to another embodiment of the inventive concept, if a well region is an N-type well region, the third impurities may include P-type impurities, and the second transistor T2 formed in the N-type well region may be a PMOS transistor. That is, every second active structure 233 with an isolated shape may have an NMOS transistor or a PMOS transistor.

Figure 23:
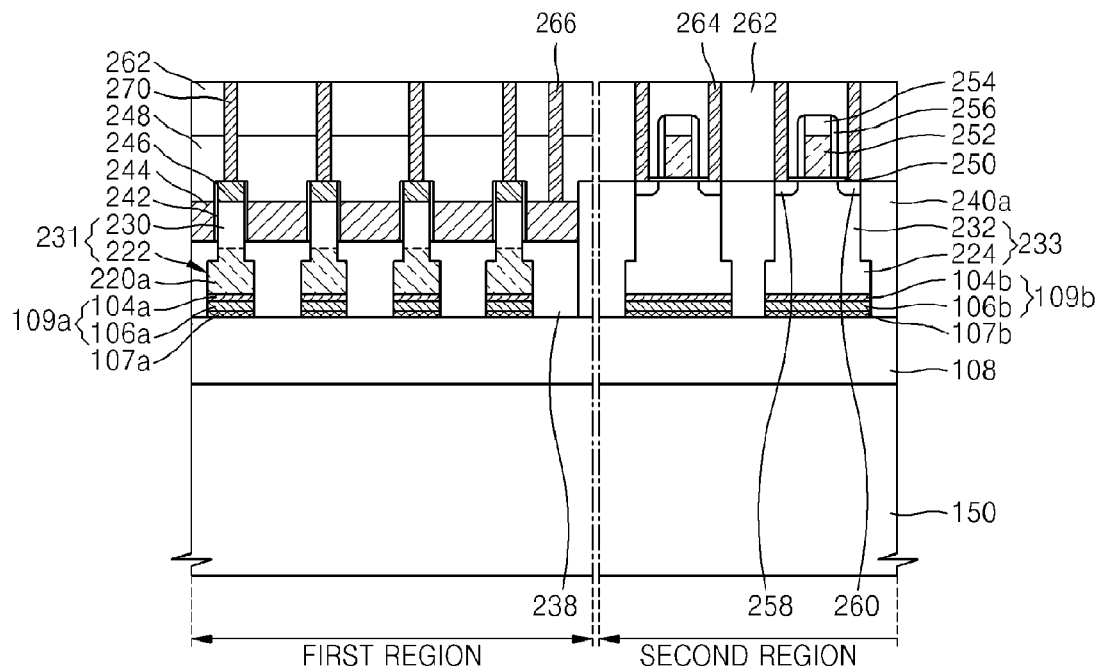

Referring to FIG. 23, the second interlayer insulating layer 262, covering the first and second active structures 231 and 233 and the first and second transistors T1 and T2, is formed. The second interlayer insulating layer 262 may be formed of oxide such as silicon oxide. For example, the second interlayer insulating layer 262 may be formed of USG, BPSG, PSG, SOG, FOX, TEOS, PE-TEOS, TOSZ, or FSG. In one embodiment, the second interlayer insulating layer 262 may be formed of the same material as the first and second field insulating layer patterns 238 and 240a.

An upper portion of the second interlayer insulating layer 262 is polished to planarize the second interlayer insulating layer 262, and then, portions of the second interlayer insulating layer 262 are etched to form first contact holes in the second interlayer insulating layer 262. The planarization of the second interlayer insulating layer 262 may be performed, for example, by chemical mechanical polishing (CMP), etch-backing, or a combination of CMP and etch-backing. The first contact holes expose the third impurity region 258 and the fourth impurity region 260.

The second and first interlayer insulating layers 262 and 248 are etched to form a second contact hole exposing an upper surface of an end of the gate electrode 244. The second and first interlayer insulating layers 262 and 248 and the first lower pattern 222 of the first active structure 231 are further etched to form third contact holes exposing portions of the first impurity region 220a and the buried interconnection line 109a. The second and first interlayer insulating layers 262 and 248 are etched to form a fourth contact hole exposing the first upper pattern 230 of the first active structure 231.

Since a thickness of a single crystal semiconductor layer formed on the supporting substrate 150 is small, the first and second active structures 231 and 233 are thin. Thus, since a layer to be etched to form contact holes is not thick, contact holes may be easily formed.

A fourth conductive layer (not shown) is formed on the second interlayer insulating layer 262 to fill the first through fourth contact holes. The fourth conductive layer may be formed, for example, of polysilicon doped with impurities, metal, and/or metal nitride. For example, the fourth conductive layer may include tungsten, titanium, tantalum, aluminum, tungsten nitride, titanium nitride, tantalum nitride, aluminum nitride, or titanium aluminum nitride.

The fourth conductive layer is removed until the second interlayer insulating layer 262 is exposed, thereby forming first through fourth contacts 264, 266, 268 (see FIG. 9), and 270. According to another embodiment, the first through fourth contacts 264, 266, 268, and 270 may instead be formed by separately performing the contact hole formation process and the contact hole filling process using a conductive layer.

Referring to FIGS. 8 and 9, the capacitor 274 that may be electrically connected to the second impurity region 246 is formed. The capacitor 274 may include a lower electrode 272a, a dielectric layer 272b, and an upper electrode 272c. The capacitor 274 may be electrically connected to the fourth contacts 270. As illustrated, the capacitor 274 may be formed such that the lower electrode 272a has a cylinder-shape. However, according to another embodiment, the capacitor 274 may be formed such that the lower electrode 272a has a stack shape.

In methods of fabricating a semiconductor device according to disclosed embodiments, the inclusion of a buried bit line including a barrier layer pattern and metal leads to a substantial decrease in resistance of the bit line.

Also, the first field insulating layer pattern 238 is formed to fill the gap between neighboring first active structures 231, and the second field insulating layer pattern 240a is formed to fill the gap between neighboring second active structures 233. In addition, the silicon oxidation layer 108 is formed under the first and second active structures 231 and 233. Due to the structure described above, neighboring first and second active structures 231 and 233 are electrically separated from each other and thus, the migration of impurities between neighboring impurity regions may be effectively prevented, and the occurrence of a P-N junction between well regions in a cell region and a logic region of a semiconductor device may be prevented. Thus, electrical characteristics and reliability of a semiconductor device having the structure described above may be significantly improved.

Figure 24:
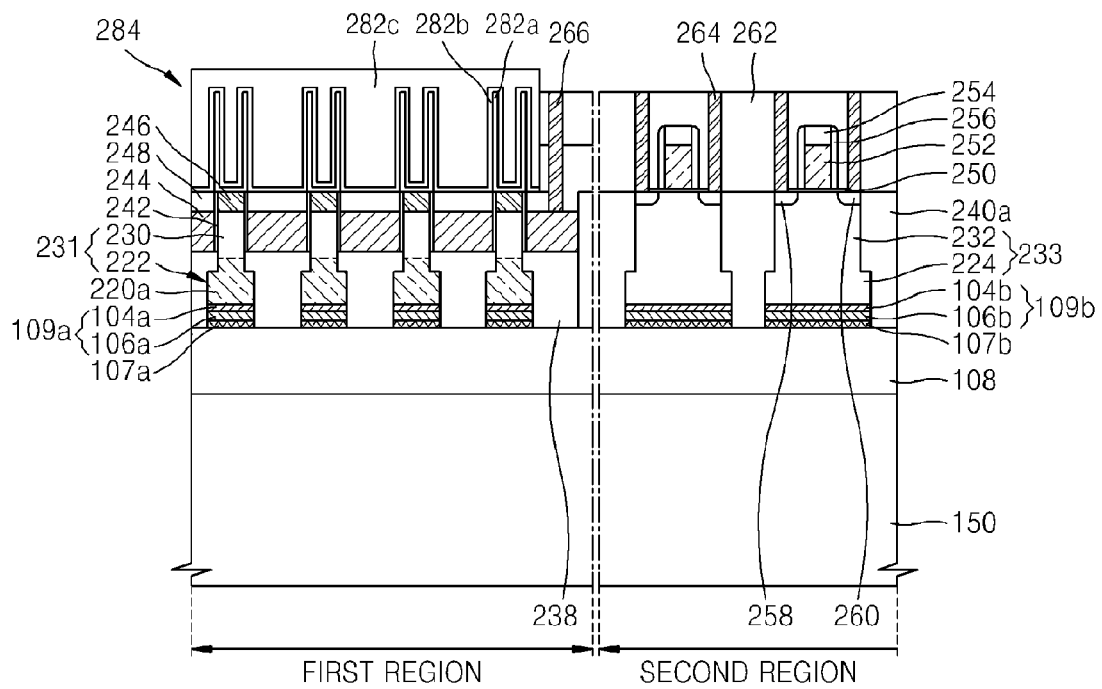
FIGS. 24 and 25 are cross-sectional views of a semiconductor device according to another embodiment.
Figure 25:
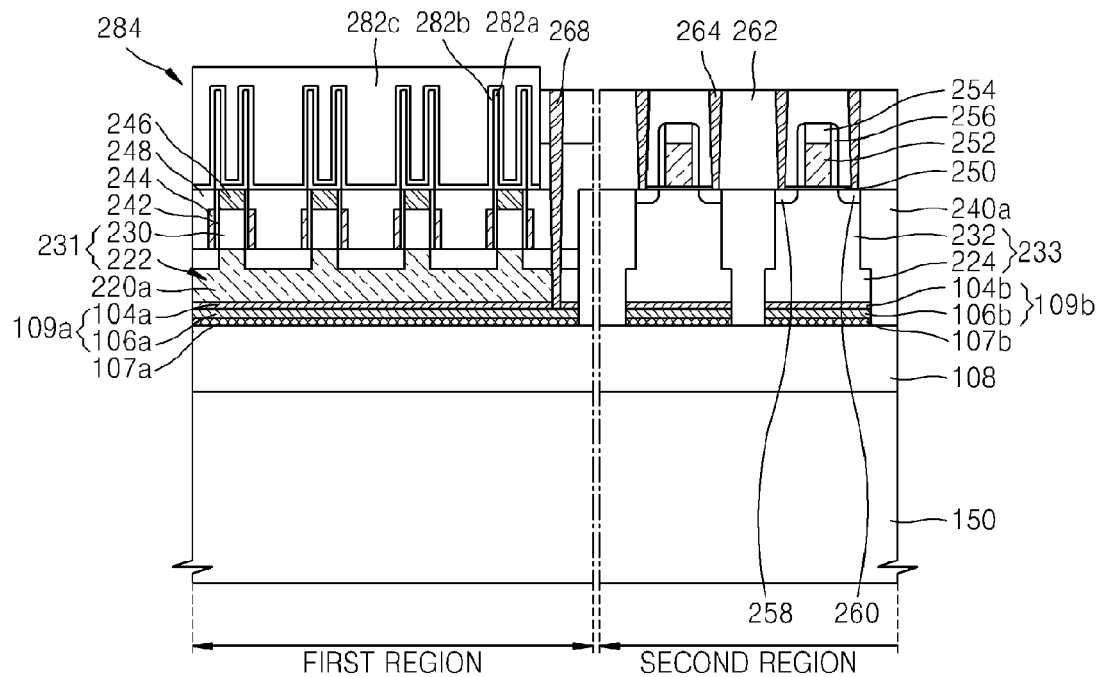

FIGS. 24 and 25 are sectional views of a semiconductor device according to another embodiment.

Referring to FIGS. 24 and 25, the semiconductor device has the same structure of the semiconductor device described with reference to FIGS. 8 and 9, except that a capacitor 284 directly contacts an upper surface of a first active structure 231.

The capacitor 284 includes a lower electrode 282a, a dielectric layer 282b, and an upper electrode 282c. The lower electrode 282a of the capacitor 284 directly contacts the upper surface of the first active structure 231 without separate contacts and is electrically connected to a second impurity region 246. Thus, the total height of the semiconductor device is reduced.

Figure 26:
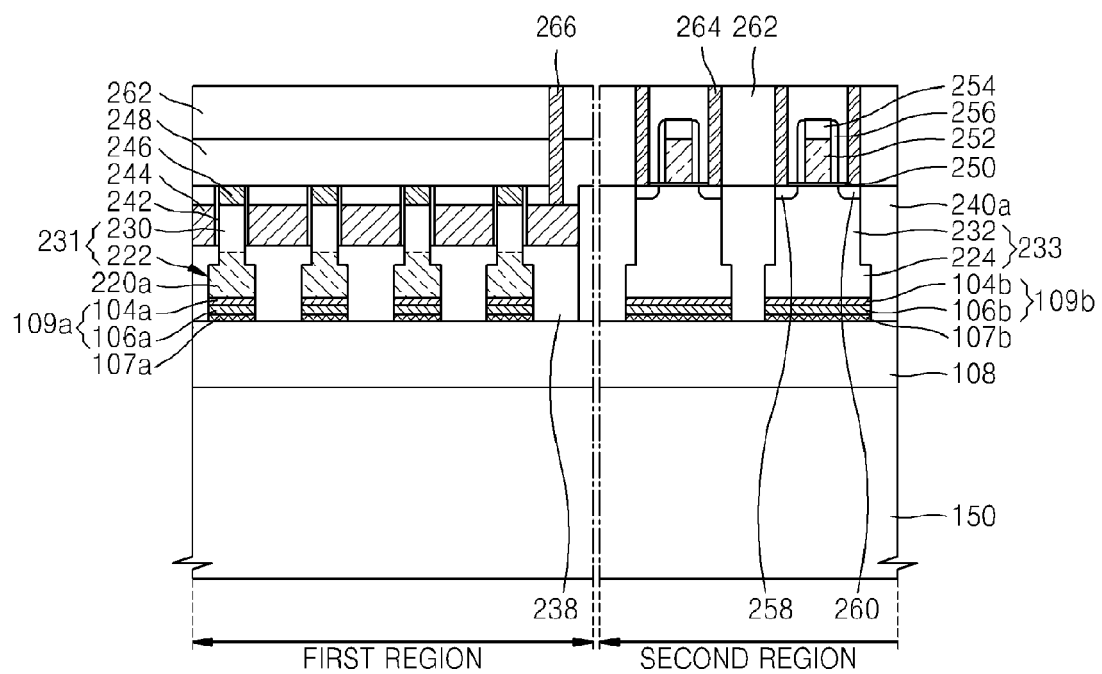
FIG. 26 is a cross-sectional view to explain a method of fabricating the semiconductor devices of FIGS. 24 and 25.

FIG. 26 is a sectional view to explain a method of fabricating the semiconductor devices of FIGS. 24 and 25.

First, the processes described with reference to FIGS. 10 through 21 are performed to form a structure as illustrated in FIG. 21.

Referring to FIG. 26, a second interlayer insulating layer 262, covering first and second active structures 231 and 233 and first and second transistors T1 and T2, is formed. The second interlayer insulating layer 262 may be formed of an oxide such as silicon oxide.

The second interlayer insulating layer 262 is planarized by polishing an upper portion of the second interlayer insulating layer 262, and portions of the second interlayer insulating layer 262 are etched to form first contact holes in the second interlayer insulating layer 262. The first contact holes expose a third impurity region 258 and a fourth impurity region 260. In addition, the second and first interlayer insulating layers 262 and 248 are etched to form a second contact hole exposing an upper surface of an end of a gate electrode.

In addition, the second and first interlayer insulating layers 262 and 248 are etched and the first lower pattern 222 of the first active structure 231 is etched to form a third contact hole exposing portions of the first impurity region 220a and the buried interconnection line 109a.

A fourth conductive layer (not shown) is formed on the second interlayer insulating layer 262 to fill the first through third contact holes. The fourth conductive layer is removed until the second interlayer insulating layer 262 is exposed, thereby forming first through third contacts 264, 266, and 268 as illustrated in FIGS. 24 through 26. According to another embodiment, the first through third contacts 264, 266, and 268 may instead be formed by separately performing the contact hole formation process and the contact hole filling process using a conductive layer.

Referring to FIGS. 24 and 25, a capacitor 284 electrically connected to the second impurity region 246 is formed. The lower electrode 282a of the capacitor 284 may contact the upper surface of the first upper pattern 230. As illustrated, the capacitor 284 may be formed such that the lower electrode 282a has a cylinder-shape. However, according to another embodiment, the capacitor 284 may be formed such that the lower electrode 282a has a stack shape.

Figure 27:
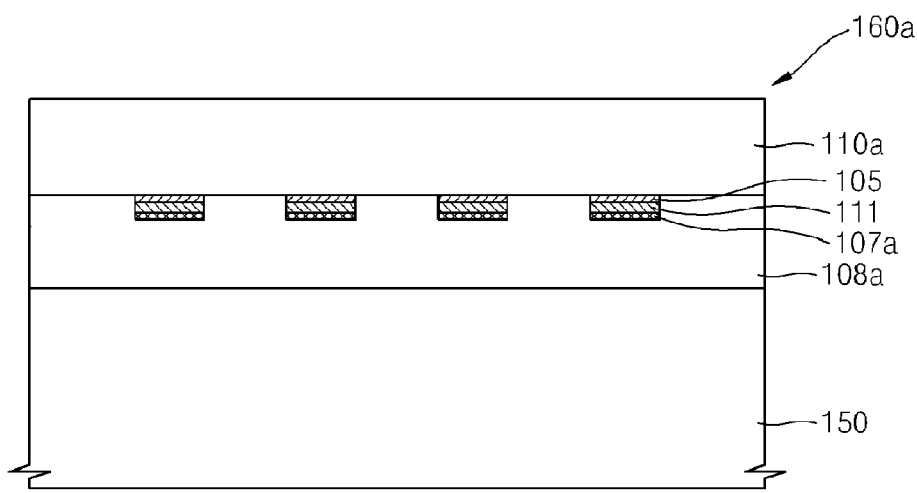
FIG. 27 is a sectional view of a conductive layer buried-type substrate according to another embodiment.

FIG. 27 is a sectional view of a conductive layer buried-type substrate 160a according to another embodiment.

In detail, the conductive layer buried-type substrate 160a according to FIG. 27 has the same structure as the conductive layer buried-type substrate 160 illustrated in FIG. 1, except that a buried conductive layer is patterned.

Referring to FIG. 27, a supporting substrate 150 and an insulating layer are directly bonded to an upper surface of the supporting substrate 150. The insulating layer may include, for example, a silicon oxidation layer 108a. A first surface of the silicon oxidation layer 108a directly bonded to the supporting substrate 150 may be leveled. An adhesion promotion layer pattern 107a, a conductive layer pattern 111, and a barrier layer pattern 105 are disposed in the silicon oxidation layer 108a. The adhesion promotion layer pattern 107a, the conductive layer pattern 111, and the barrier layer pattern 105 may have a shape filling a groove in the silicon oxidation layer 108a.

As described above, in the conductive layer buried-type substrate 160a according to the present embodiment, the conductive layer pattern 111 that is used as an interconnection line is interposed between the supporting substrate 150 and the single crystal semiconductor layer 110a. In addition, the conductive layer buried-type substrate 160a according to the present embodiment includes the adhesion promotion layer pattern 107a capable of improving an adhesion between the silicon oxidation layer 108a and the conductive layer pattern 111. Due to the adhesion promotion layer pattern 107a, the possibility of separation between the silicon oxidation layer and the conductive layer pattern 111 may be reduced. In one embodiment, the adhesion promotion layer pattern 107a may be formed of the same material as described with reference to FIG. 1.

The single crystal semiconductor layer 110a is disposed on the conductive layer pattern 111 and an upper surface of the silicon oxidation layer 108a. The single crystal semiconductor layer 110a may be a single crystal silicon layer. In one embodiment, the single crystal semiconductor layer 110a may have a thickness that is equal to or less than 1 μm. For example, the thickness of the single crystal semiconductor layer 110a may be in the range of 1000 to 6000 Å. An upper surface of the single crystal semiconductor layer 110a may have a high degree of planarization. As described above, since the single crystal semiconductor layer 110a has a thickness that is equal to or less than 1 μm and a planarized upper surface, the single crystal semiconductor layer 110a is very appropriate for fabricating a semiconductor device.

The barrier layer pattern 105 and the conductive layer pattern 111 may be formed of the same materials as the barrier layer 104 and the conductive layer 106 described with reference to FIG. 1. As described above, in the conductive layer buried-type substrate 160a according to the present embodiment, the adhesion promotion layer pattern 107a and the buried interconnection line including the barrier layer pattern 105 and the conductive layer pattern 111 are interposed between the supporting substrate 150 and the single crystal semiconductor layer 110a.

FIG. 28 through FIG. 31 are sectional views to explain an exemplary method of forming the conductive layer buried-type substrate 106a of FIG. 27.

First, the processes described with reference to FIGS. 2 through 4 are performed to form a hydrogen ion implantation layer 102 in a donor substrate 100. Then, the barrier layer 104, the conductive layer 106, and the adhesion promotion layer 107 are formed on a first surface 51 of the donor substrate 100.

Figure 28:
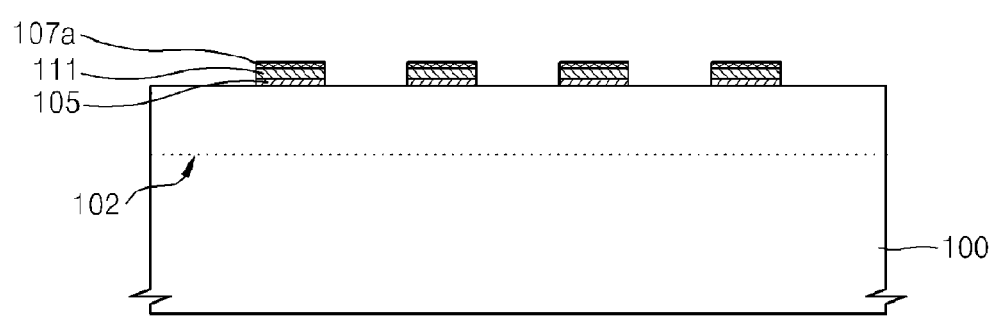
FIG. 28 through FIG. 31 are sectional views to explain a method of forming the conductive layer buried-type substrate of FIG. 27, according to an exemplary embodiment.

Referring to FIG. 28, an etch mask is formed on the adhesion promotion layer 107, and by using the etch mask, the adhesion promotion layer 107, the conductive layer 106, and the barrier layer 104 are sequentially etched to form the adhesion promotion layer pattern 107a, the barrier layer pattern 105, and the conductive layer pattern 111. The barrier layer pattern 105 and the conductive layer pattern 111 may have a pattern shape that is appropriate for a structure of an interconnection line of a device. For example, the barrier layer pattern 105 and the conductive layer pattern 111 may have a line-shape or a pad-shape.

Figure 29:
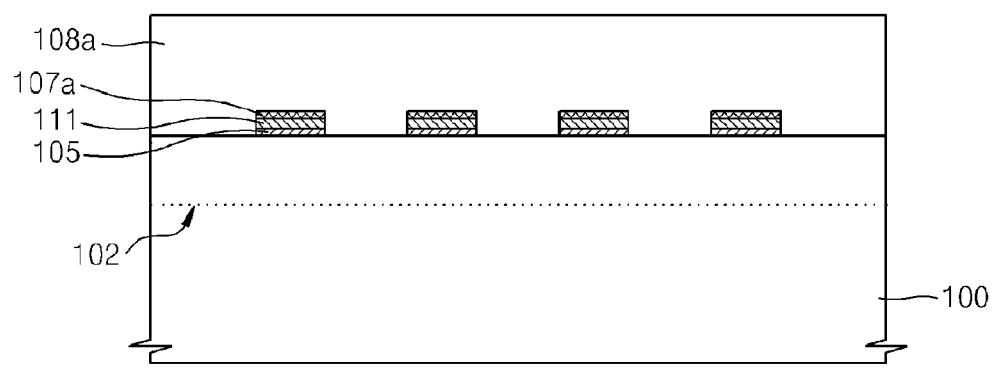

Referring to FIG. 29, the silicon oxidation layer 108a is formed to fill gaps between the adhesion promotion layer patterns 107a, barrier layer patterns 105, and conductive layer patterns 111 and to cover the adhesion promotion layer pattern 107a, the barrier layer pattern 105, and the conductive layer pattern 111. The silicon oxidation layer 108a may be deposited at a temperature, for example, of room temperature to 400 μm. The adhesion promotion layer pattern 107a may improve an adhesion between the conductive layer pattern 111 and the silicon oxidation layer 108a.

After the silicon oxidation layer 108a is formed, a process for planarizing a surface of the silicon oxidation layer 108a may be further performed. The planarization process may include CMP or blanket etch-back. The surface of the silicon oxidation layer 108a may be a contact surface that is bonded to the supporting substrate 150. By performing the processes as described above, the barrier layer pattern 105, the conductive layer pattern 111, the adhesion promotion layer pattern 107a, and the silicon oxidation layer 108a are deposited on the first surface S1 of the donor substrate 100.

Figure 30:
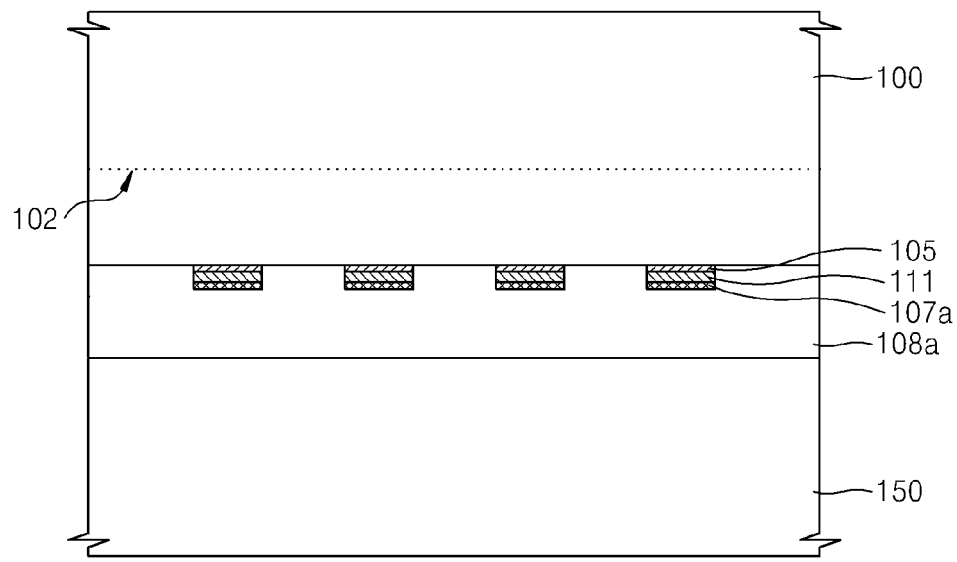

Referring to FIG. 30, the supporting substrate 150 that is to contact the donor substrate 100 is prepared. The supporting substrate 150 may be, as described with reference to FIG. 1, a silicon substrate. In addition, a low-grade substrate with crystal defects or particles may also be used as the supporting substrate 150. The supporting substrate 150 is bonded to the silicon oxidation layer 108a formed on the donor substrate 100. The bonding may be performed through the same processes described with reference to FIGS. 5 and 6.

Figure 31:
Figure 31:
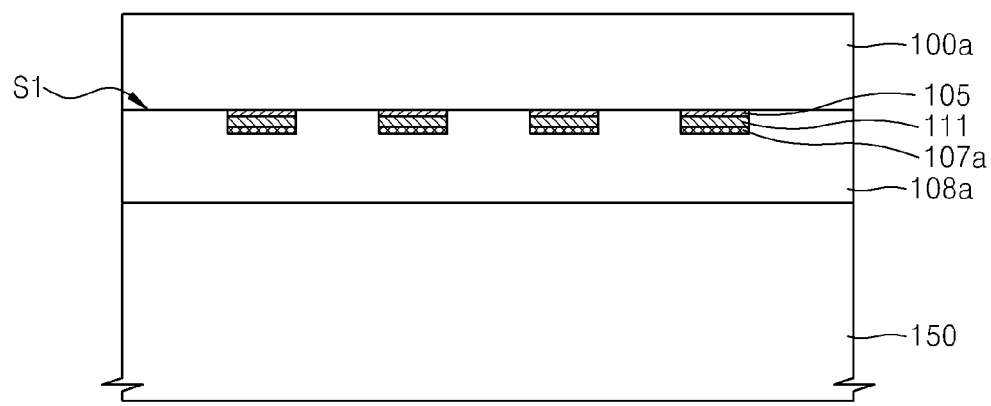

Referring to FIG. 31, the donor substrate 100 is smart-cut along the hydrogen ion implantation layer 102. The smart-cutting may be performed by thermally treating the donor substrate 100 at a temperature equal to or higher than 400 μm. By the smart-cutting, a single crystal semiconductor layer 100a is formed on the barrier layer pattern 105 and the silicon oxidation layer 108a. In one embodiment, the single crystal semiconductor layer 100a may have a thickness equal to or lower than 1 μm. For example, the single crystal semiconductor layer 100a may have a thickness in a range of 1000 to 6000 Å. A second donor substrate 100b separated from the donor substrate 100 by smart-cutting may be reused to form another conductive layer buried-type substrate.

Semiconductor devices according to the disclosed embodiments may be embodied in various types or may be used as a component in various apparatuses. For example, a dynamic random-access memory (DRAM) device fabricated using the methods as described above may be used to produce various memory devices, for example, various memory cards, a USB memory, a solid-state driver SSD. This will now be described in detail.

Figure 32:
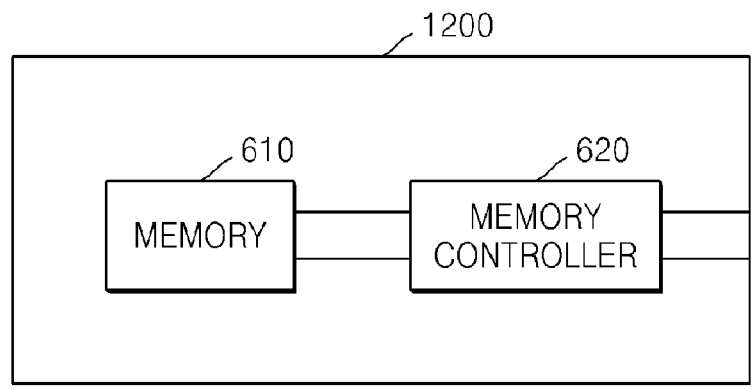
FIG. 32 is a schematic diagram of a memory device including a semiconductor device according to an exemplary embodiment.

FIG. 32 is a schematic diagram of a memory device 1200 including a semiconductor device according to one or more of the disclosed embodiments.

In detail, the memory device 1200 according to the one embodiment includes a memory 610 and a memory controller 620. The memory 610 may include at least one semiconductor device selected from the group consisting of the semiconductor devices according to the above embodiments. The memory 610 may include, for example, a DRAM device manufactured by using the methods according to the above embodiments of the inventive concept. The memory controller 620 may supply an input signal for controlling an operation of the memory 610. For example, the memory controller 620 may supply a command signal and an address signal. The memory controller 620 may control the memory 610 based on a control signal that is transmitted. The embodiments are not limited to a DRAM, however, and the concepts and structures described herein may be applied to other types of memory, such as flash memory, EEPROM, or other types of memory that employ an array of bit lines and word lines.

Figure 33:
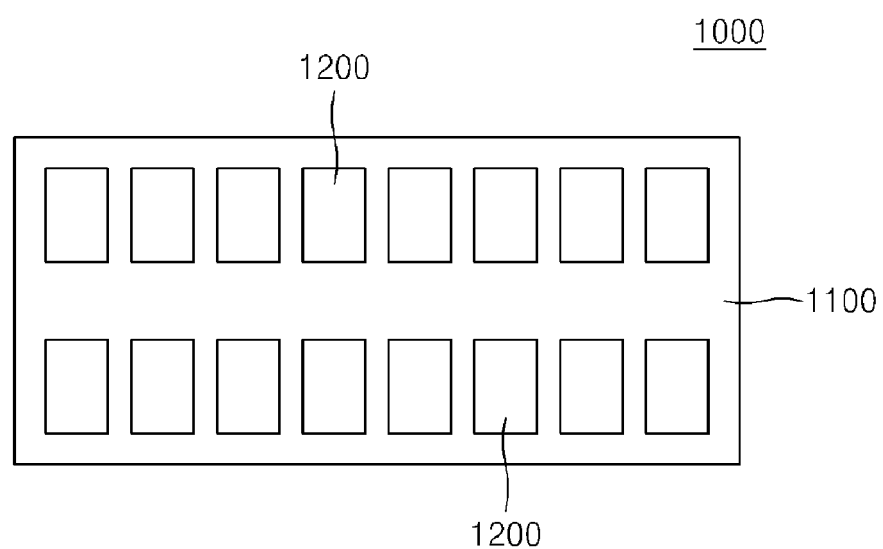
FIG. 33 is a plane view of a memory module including a semiconductor device according to an exemplary embodiment.

FIG. 33 is a plane view of a memory module 1000 including a semiconductor device according to one embodiment.

In detail, the memory module 1000 may include a printed circuit board 1100 and a plurality of semiconductor packages 1200. The semiconductor packages 1200 may include semiconductor devices according to embodiments disclosed herein. For example, the semiconductor packages 1200 may include at least one semiconductor device selected from the group consisting of the semiconductor devices according to the above disclosed embodiments.

The memory module 1000 according to the present embodiment may be, for example, a single in-lined memory module (SIMM) in which the semiconductor packages 1200 are mounted only to one surface of the printed circuit board 1100, or a dual in-line memory module (DIMM) in which the semiconductor packages 1200 are mounted to two surfaces of the printed circuit board 1100. The memory module 1000 according to the present embodiment may also be a fully buffered DIMM (FBDIMM) including an advanced memory buffer (AMB) for providing external signals to the semiconductor packages 1200.

Figure 34:
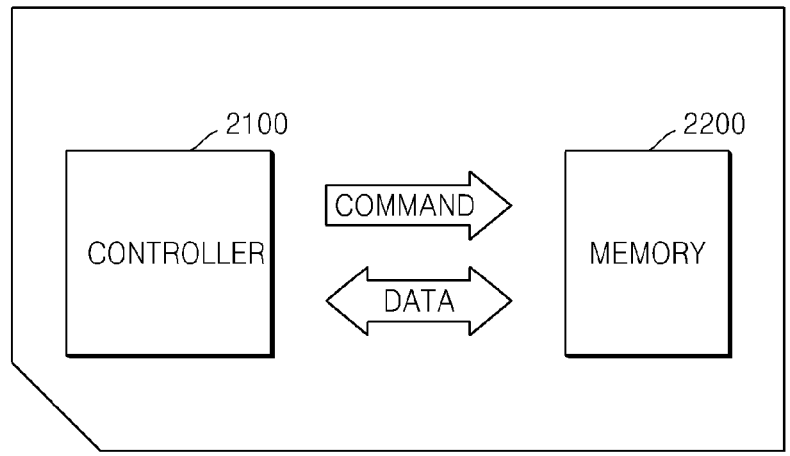
FIG. 34 is a schematic diagram of a memory card including a semiconductor device according to an exemplary embodiment.

FIG. 34 is a schematic diagram of a memory card 2000 including a semiconductor device according to an exemplary embodiment.

In detail, the memory card 2000 includes a controller 2100 and a memory 2200 which are arranged to exchange an electric signal. For example, if the controller 2100 transmits a command order, the memory 2200 may transmit data.

The memory 2200 may include semiconductor devices according to embodiments disclosed herein. For example, the memory 2200 may include at least one semiconductor device selected from the group consisting of the semiconductor devices according to the above embodiments.

The memory card 2000 may not be limited, and may be, for example, a memory stick card, a smart media card (SM), a secure digital card: (SD), a mini-secure digital card: (SD), or a multimedia card: (MMC).

Figure 35:
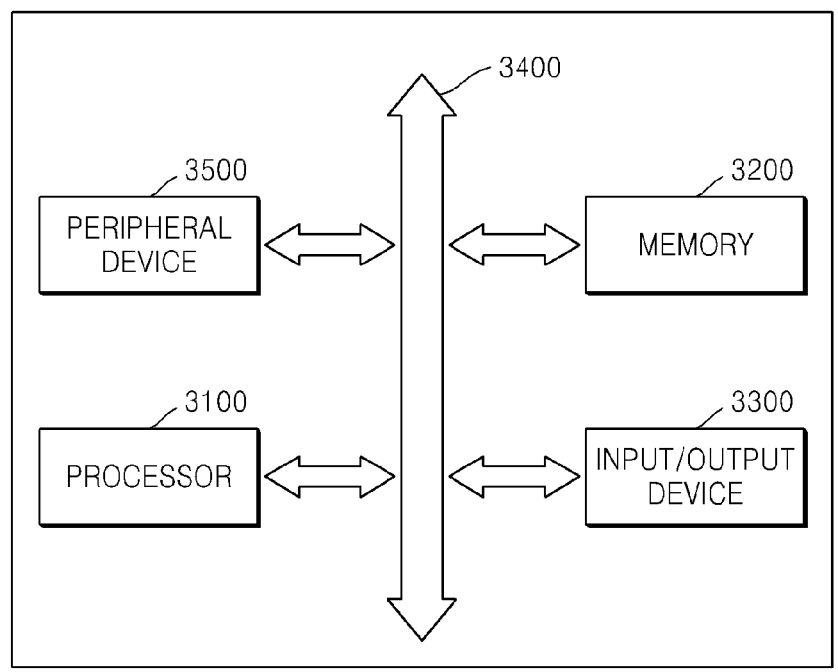
FIG. 35 is a schematic diagram of a system including a semiconductor device according to an exemplary embodiment.

FIG. 35 is a schematic diagram of a system 3000 including a semiconductor device according to an exemplary embodiment.

In detail, in the system 3000, a processor 3100, a memory 3200, and an input/output device 3300 communicate data to each other via a bus 3400. The memory 3200 of the system 3000 may include a random-access memory (RAM) or read-only memory (ROM). In addition, the system 3000 may also include a peripheral device 3500, such as a floppy disk drive or a compact disk (CD) ROM drive.

The memory 3200 may include semiconductor devices according to embodiments disclosed herein. For example the memory 3200 may include at least one semiconductor device selected from the group consisting of the semiconductor devices according to the above embodiments.

The memory 3200 may store codes and data for driving the processor 3100. The system 3000 may be used in devices such as, for example, a mobile phone, an MP3 player, a navigation device, a portable multimedia player (PMP), a solid state disk (SSD), or household appliances.

While the present disclosure has been particularly shown and described with reference to exemplary embodiments thereof, it will be understood that various changes in form and details may be made therein without departing from the spirit and scope of the following claims.

What is claimed is:

1. A method of fabricating a semiconductor device including forming a conductive layer buried-type substrate, the method comprising:
    forming a hydrogen ion implantation layer by implanting hydrogen ions under a first surface of a single crystal semiconductor substrate;

forming a conductive layer comprising a metal layer on the first surface of the single crystal semiconductor substrate;

forming an adhesion promotion layer on an upper surface of the conductive layer to improve an adhesion between the conductive layer and a silicon oxidation layer, which is formed after the conductive layer is formed;

forming the silicon oxidation layer on an upper surface of the adhesion promotion layer;

forming a preliminary conductive layer buried-type substrate by bonding the silicon oxidation layer to a supporting substrate; and forming a conductive layer buried-type substrate comprising a single crystal semiconductor layer on the conductive layer by dividing the single crystal semiconductor substrate along the hydrogen ion implantation layer.

2. The method of claim 1, wherein a distance between the first surface of the single crystal semiconductor substrate and the hydrogen ion implantation layer is in a range of 1000 to 10000 Å.

3. The method of claim 1, wherein processes performed before the single crystal semiconductor substrate is divided along the hydrogen ion implantation layer are performed at a temperature between 25° C. to 400° C.

4. The method of claim 1, wherein the forming of the preliminary conductive layer buried-type substrate by bonding the silicon oxidation layer to the supporting substrate comprises hydrophilicizing a contact surface between the silicon oxidation layer and the supporting substrate.

5. The method of claim 1, further comprising:
forming a plurality of first active structures, each of which comprises a first lower pattern extending in a first direction and a first upper pattern protruding from the first lower pattern and including an array of column-shaped structures, by etching a portion of the single crystal semiconductor layer corresponding to a first region;
forming a plurality of buried interconnection lines extending in the first direction by etching the conductive layer between the neighboring first active structures;
forming a first gate insulating layer for each of the column-shaped structures, and a first gate electrode on side walls of the column-shaped structures of the first upper pattern, wherein a portion the first upper pattern extends above the first gate electrode;
forming a first impurity region electrically connected to the buried interconnection line in the first lower pattern located under the gate electrode; and
forming a second impurity region in the first upper pattern located above the gate electrode.

6. The method of claim 5, further comprising:
forming an interlayer insulating layer covering the first active structures;
forming a first contact that is connected to the first gate electrode through the interlayer insulating layer; and
forming a second contact that is connected to the first impurity region and the buried interconnection line through the interlayer insulating layer.

7. The method of claim 5, further comprising:
forming a plurality of second active structures on a portion of the conductive layer corresponding to a second region by etching a portion of the single crystal semiconductor layer corresponding to the second region; and
forming a conductive structure by etching a portion of the conductive layer exposed by the second active structures.

8. The method of claim 7, further comprising:
forming a second gate insulating layer on an upper surface of each of the second active structures;
forming a second gate electrode on the second gate insulating layer; and
forming a third impurity region and a fourth impurity region in an upper portion of each of the second active structures adjacent to the second gate electrode.

9. The method of claim 5, wherein a lower surface of the first impurity region contacts an upper surface of the buried interconnection line.

10. The method of claim 5, wherein the forming of the first active structures comprises:
forming a first mask extending in the first direction on the single crystal semiconductor layer;
forming a preliminary first upper pattern by etching a portion of the crystal semiconductor layer using the first mask as an etch mask;
forming a first lower pattern by etching a portion of the single crystal semiconductor layer under the preliminary first upper pattern;
forming a second mask extending in a second direction perpendicular to the first direction on the preliminary first upper pattern; and
forming a first upper pattern with a column-shape structures protruding from the first lower pattern by etching the preliminary first upper pattern by using the second mask as an etch mask.

11. The method of claim 10, further comprising:
forming a spacer on side walls of the preliminary first upper pattern; and
forming a preliminary first impurity region by implanting first impurities in portions of the single crystal semiconductor layer exposed on sides of the first lower pattern.

12. The method of claim 11, wherein the first impurity region is formed by etching the preliminary first impurity region during the formation of the first lower pattern.

13. The method of claim 10, wherein the buried interconnection line is formed by etching portions of the conductive layer on sides of the first lower pattern.

* * * * *